United States Patent
Kurosaki et al.

(10) Patent No.: US 7,365,391 B2
(45) Date of Patent: Apr. 29, 2008

(54) SEMICONDUCTOR DEVICE AND METHOD FOR MANUFACTURING THEREOF

(75) Inventors: Toru Kurosaki, Saitama (JP); Shinji Kunori, Saitama (JP); Mizue Kitada, Saitama (JP); Kosuke Ohshima, Saitama (JP); Hiroaki Shishido, Saitama (JP); Masato Mikawa, Saitama (JP)

(73) Assignee: Shindengen Electric Manufacturing Co., Ltd., Tokyo (JP)

( * ) Notice: Subject to any disclaimer, the term of this patent is extended or adjusted under 35 U.S.C. 154(b) by 1 day.

(21) Appl. No.: 11/528,637

(22) Filed: Sep. 28, 2006

(65) Prior Publication Data

US 2007/0045726 A1    Mar. 1, 2007

Related U.S. Application Data

(63) Continuation of application No. PCT/JP2005/004177, filed on Mar. 10, 2005.

(30) Foreign Application Priority Data

Mar. 29, 2004   (JP) .............................. 2004-095753

(51) Int. Cl.
    *H01L 31/00* (2006.01)
(52) U.S. Cl. .................. 257/341; 257/330; 257/332; 257/E29.257
(58) Field of Classification Search ......... 257/330–341
    See application file for complete search history.

(56) References Cited

U.S. PATENT DOCUMENTS 6,194,741 B1 * 2/2001 Kinzer et al. ................ 257/77
6,876,034 B2 * 4/2005 Kurosaki et al. ............ 257/330
6,991,997 B2 * 1/2006 Takayama et al. .......... 438/471
7,196,376 B2 * 3/2007 Kurosaki et al. ............ 257/341
2003/0042555 A1 * 3/2003 Kitada et al. ............... 257/401

FOREIGN PATENT DOCUMENTS

| JP | 10-070271 | 3/1998 |
| JP | 2004-039655 | 2/2004 |
| JP | 2004-064051 | 2/2004 |

* cited by examiner

*Primary Examiner*—Zandra V. Smith
*Assistant Examiner*—Telly D Green
(74) *Attorney, Agent, or Firm*—Kratz, Quintos & Hanson, LLP

(57) ABSTRACT

A semiconductor device having high withstand voltage is provided. An active groove 22*a* includes a long and narrow main groove part 26 and a sub groove part 27 connected to a longitudinal side surface of the main groove part, and a buried region 24 of a second conductivity type whose height is lower than the bottom surface of the base diffusion region 32*a* of the second conductivity type is provided on the bottom surface of the main groove part 26. An active groove filling region 25 of the second conductivity type in contact with the base diffusion region 32*a* is provided in the sub groove part 27. The buried region 24 is contacted to the base diffusion region 32*a* through the active groove filling region 25. Since one gate groove 83 is formed by the part above the buried region 24 in one active groove 22*a*, the gate electrode plugs 48 are not separated, which allows the electrode pattern to be simplified.

10 Claims, 27 Drawing Sheets

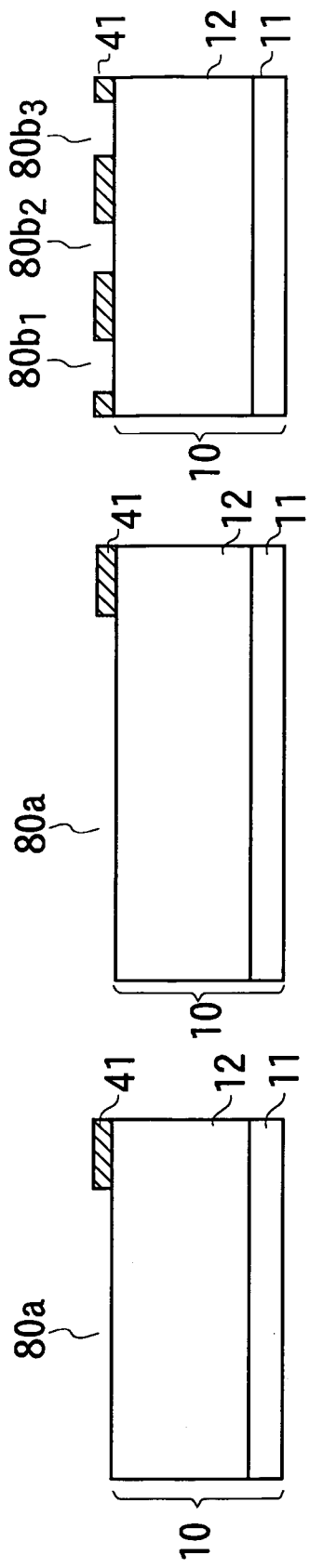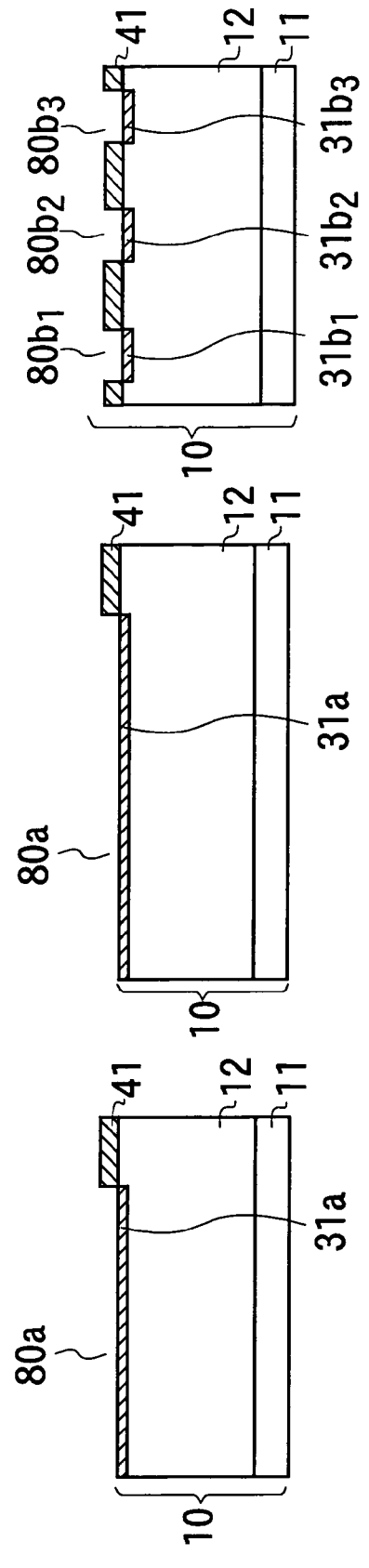

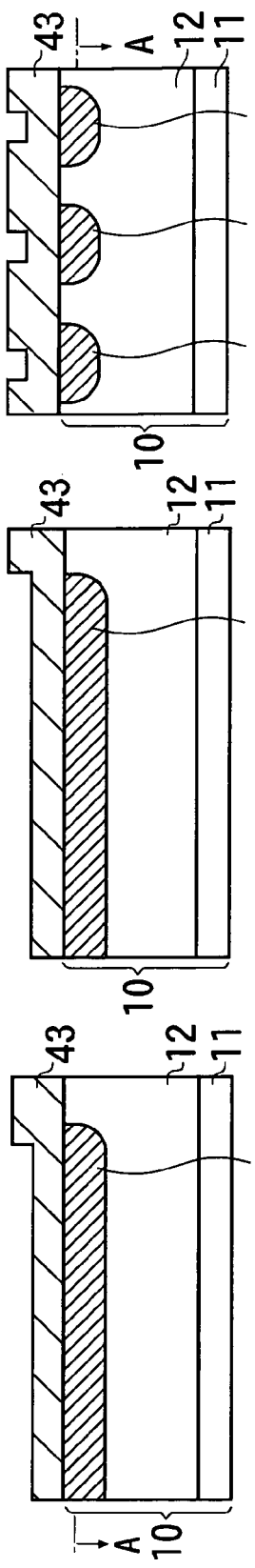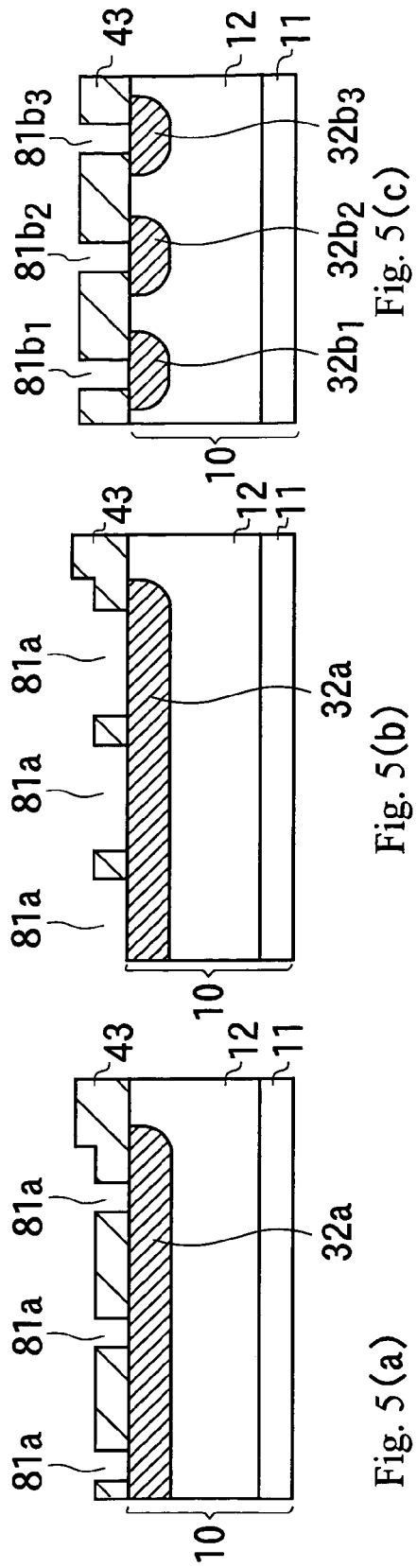

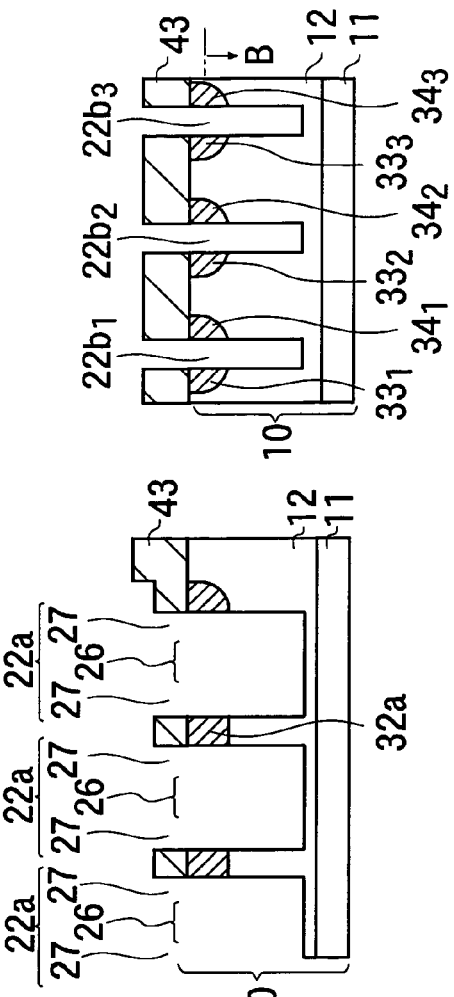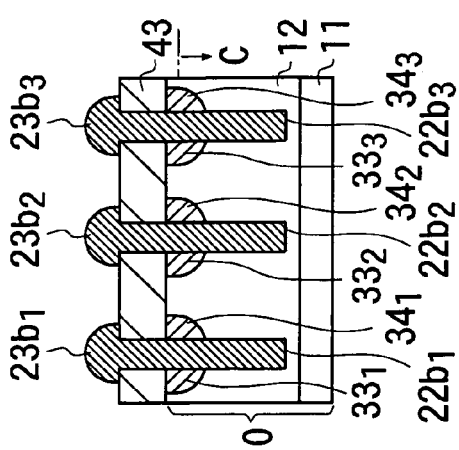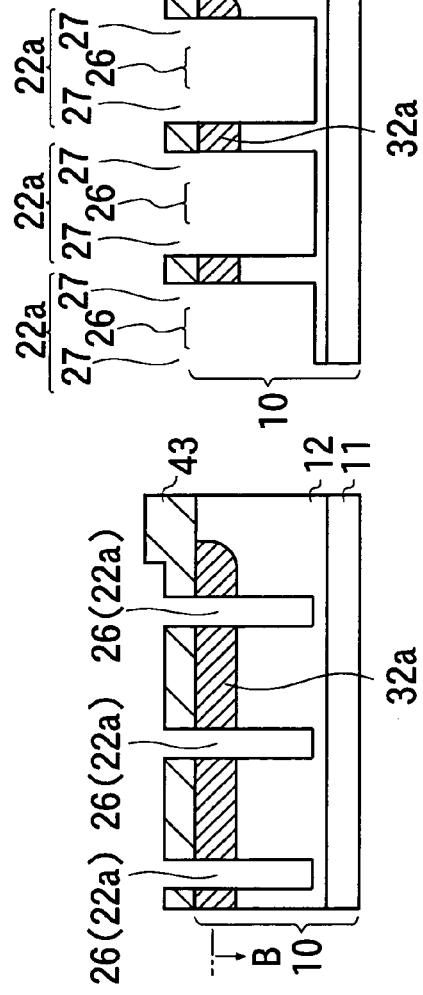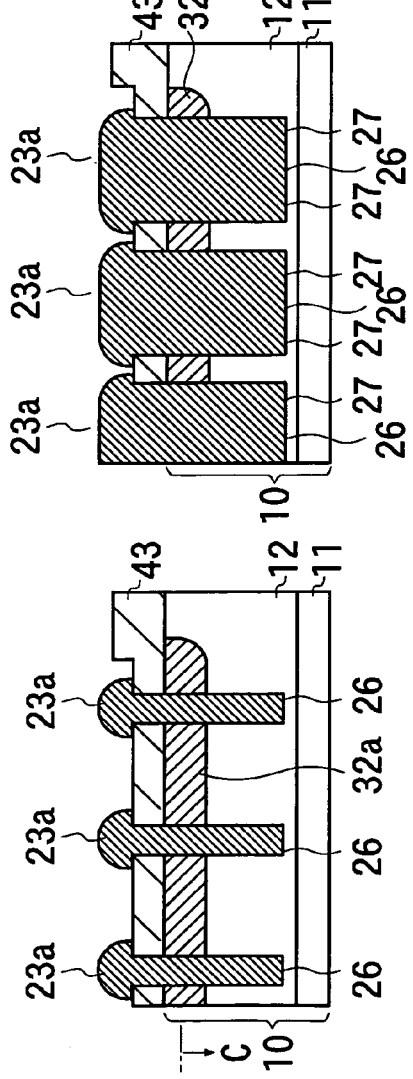

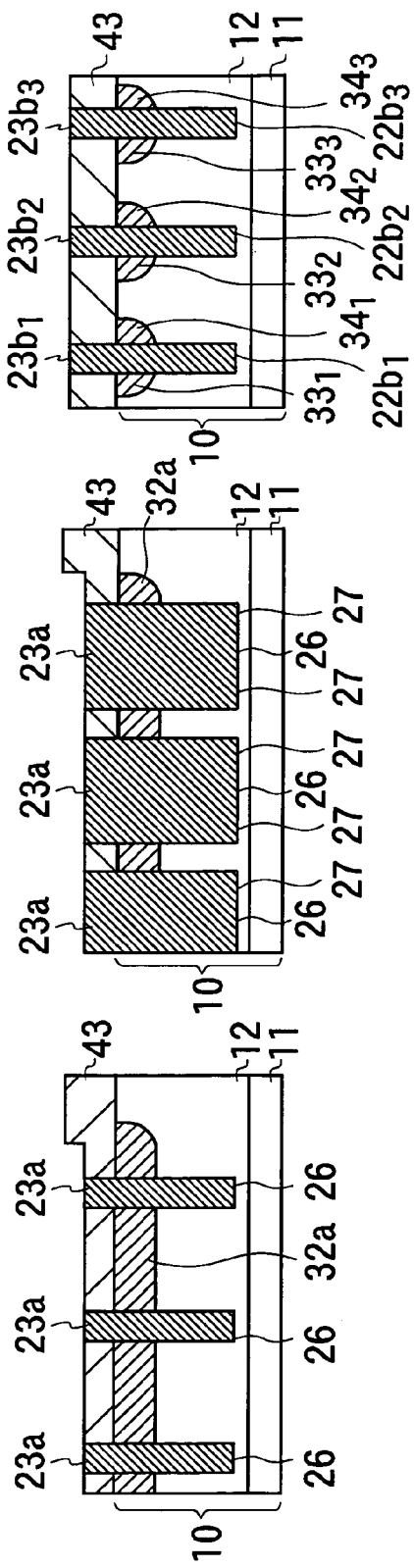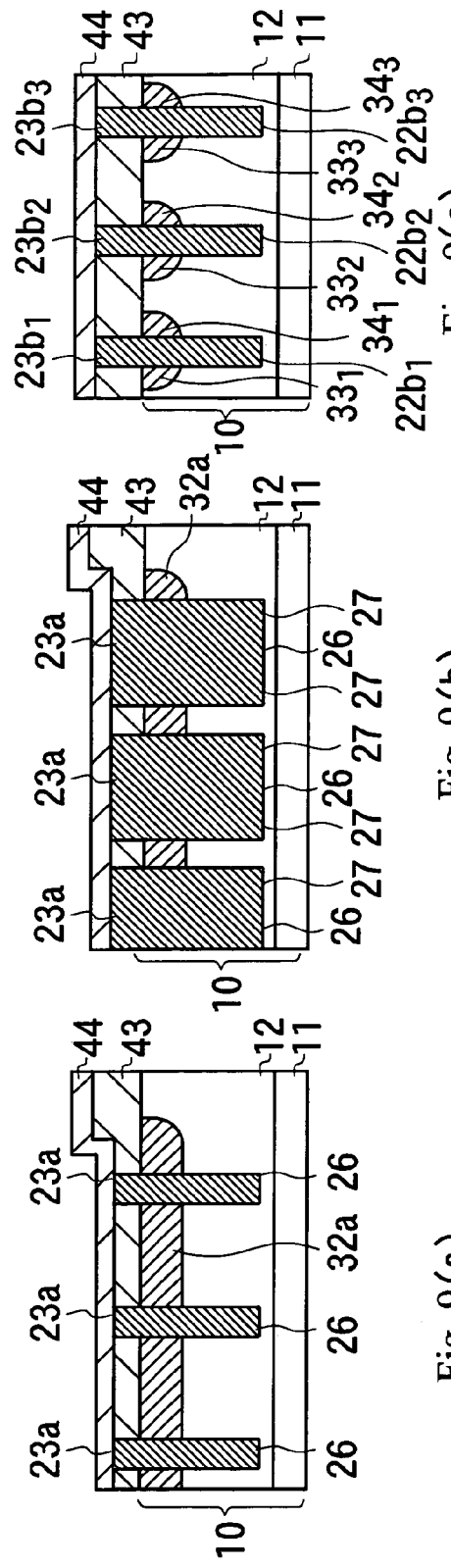

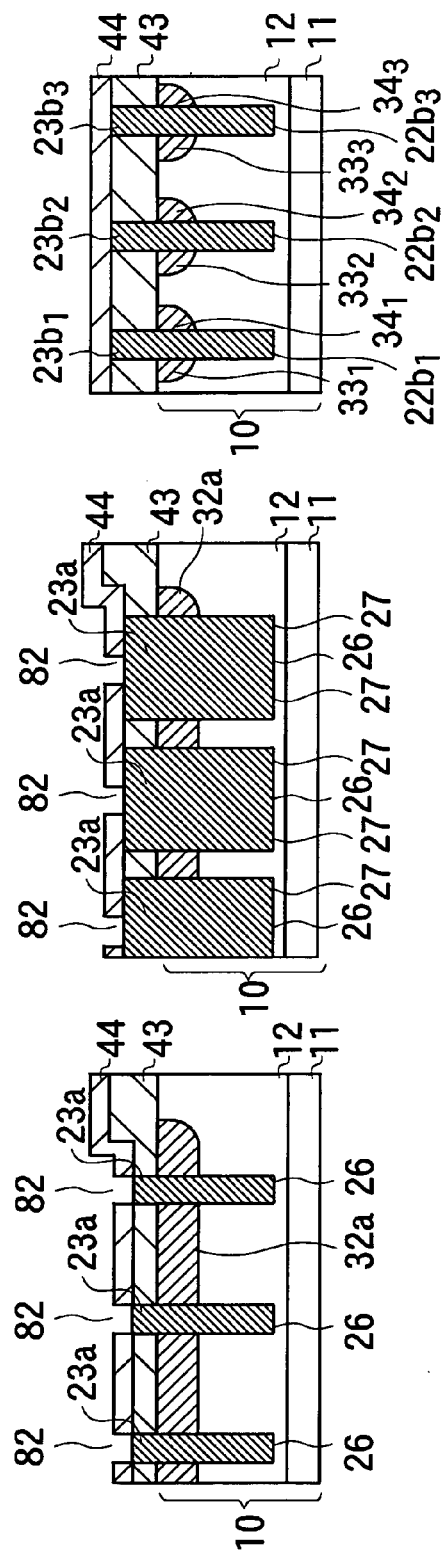
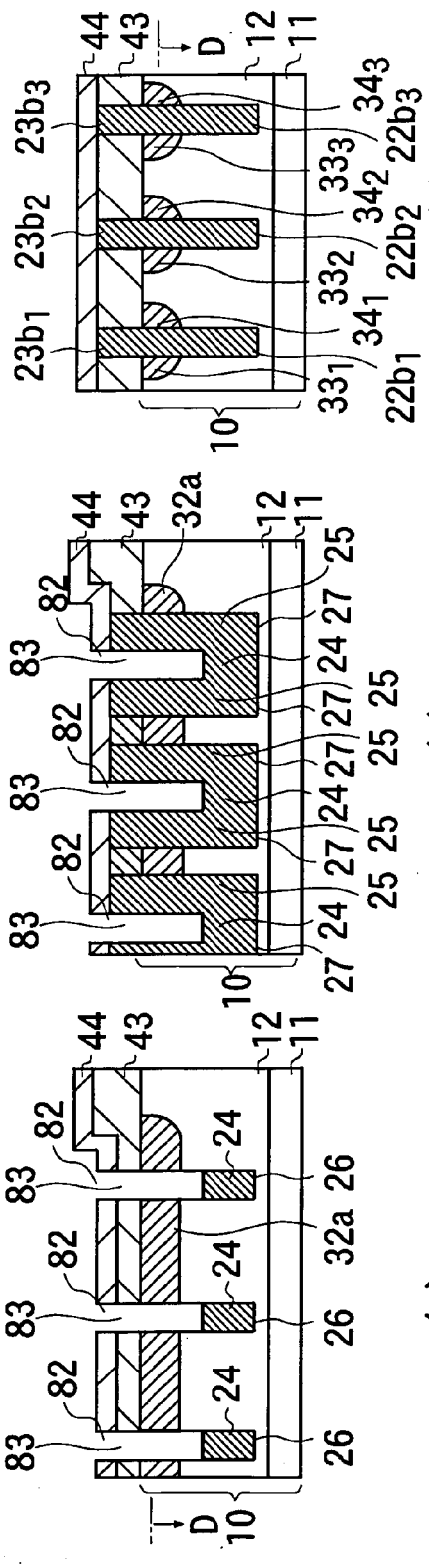

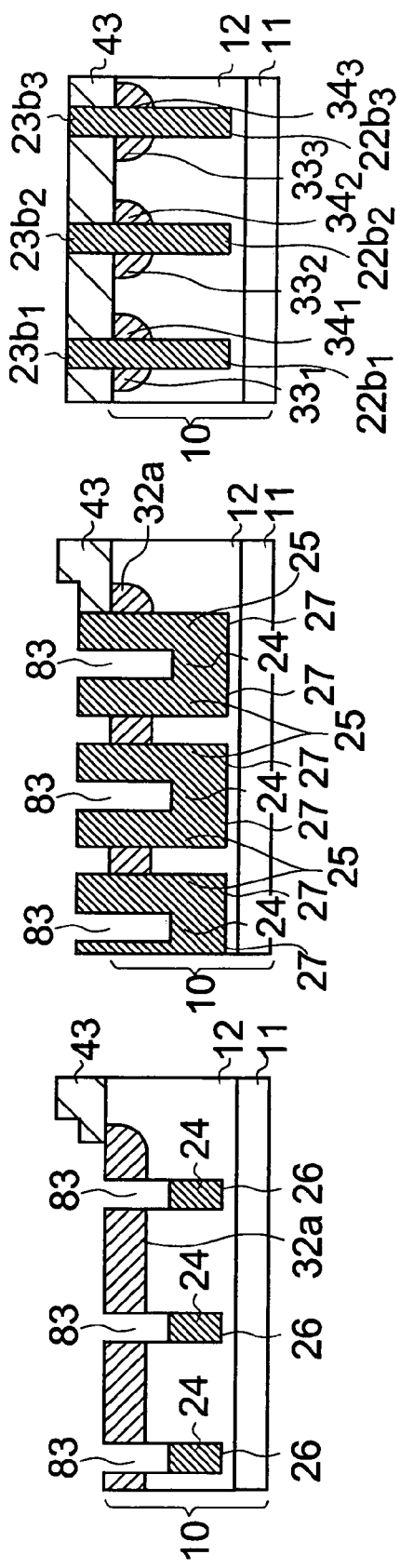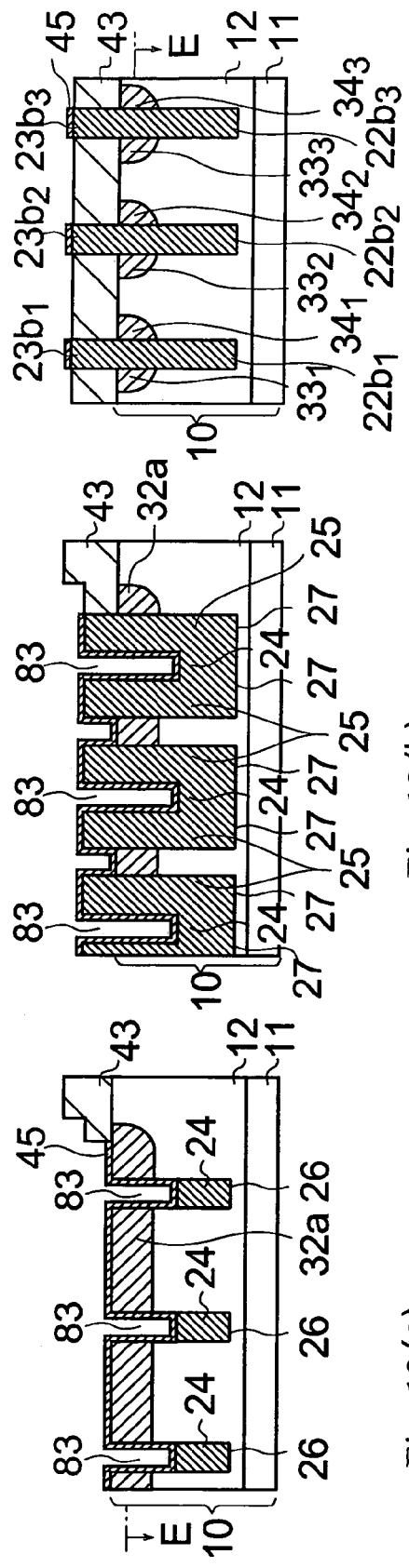

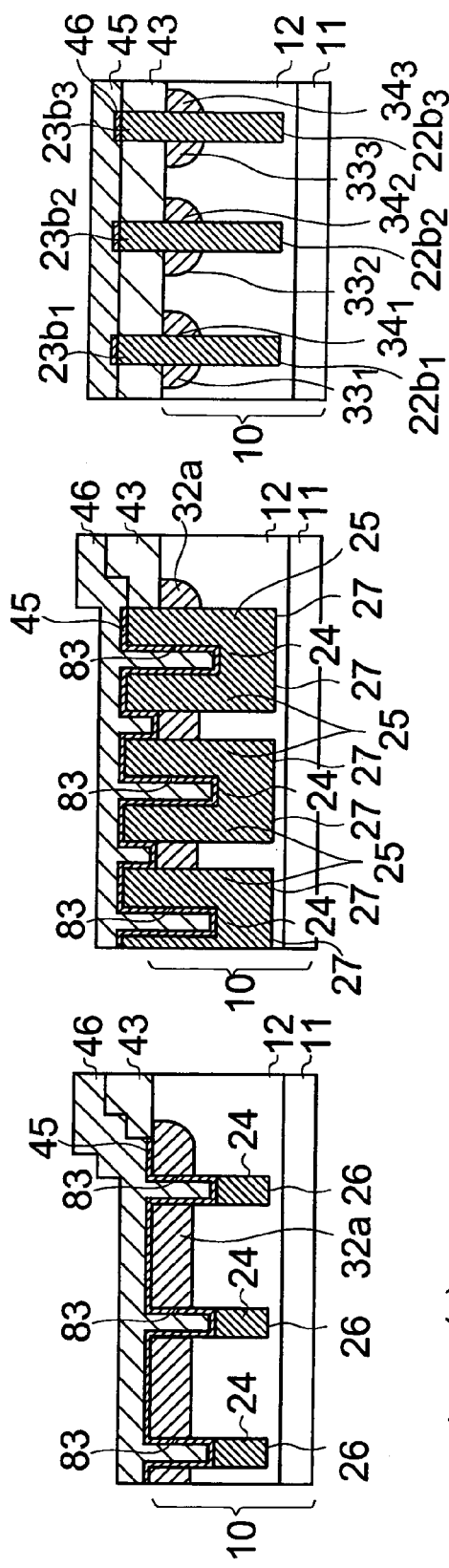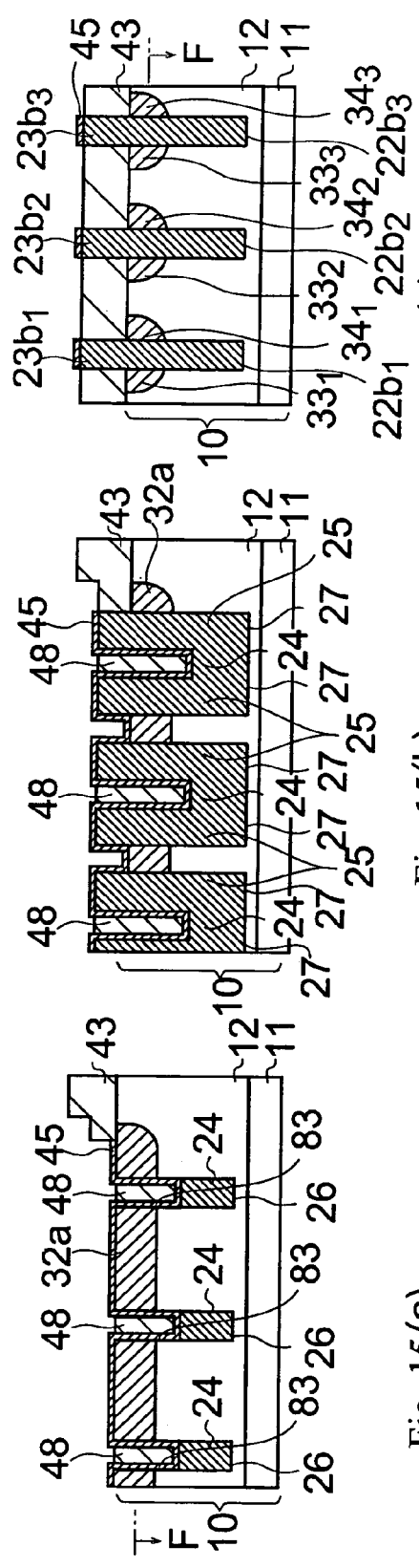

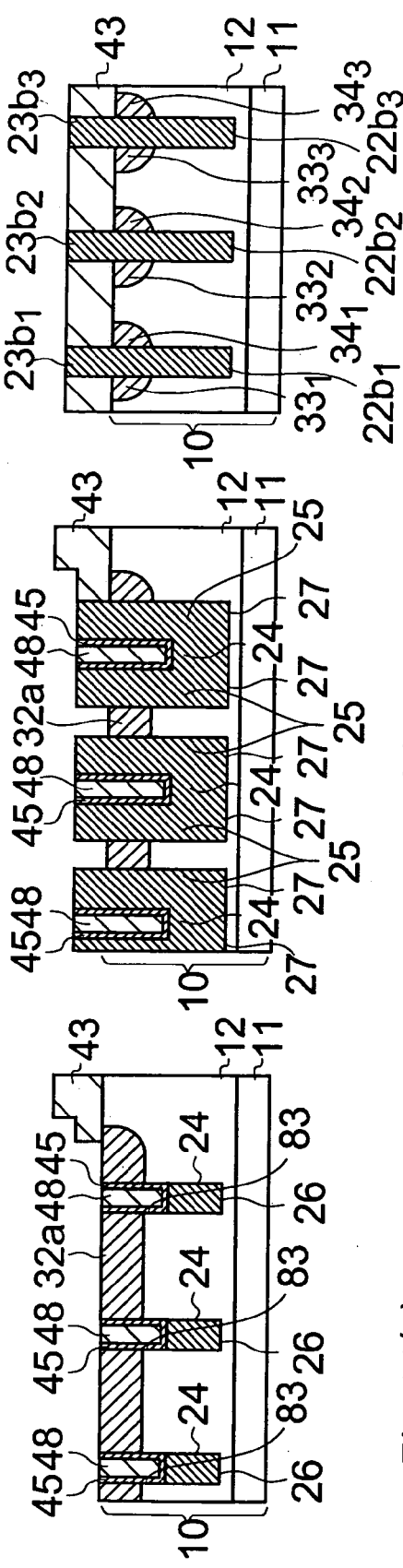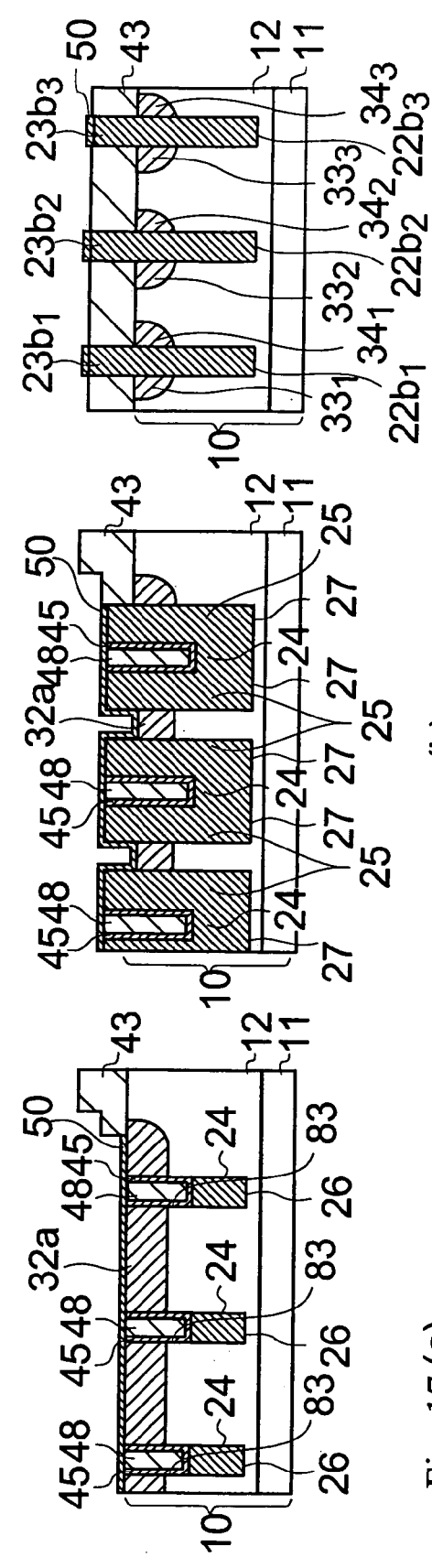

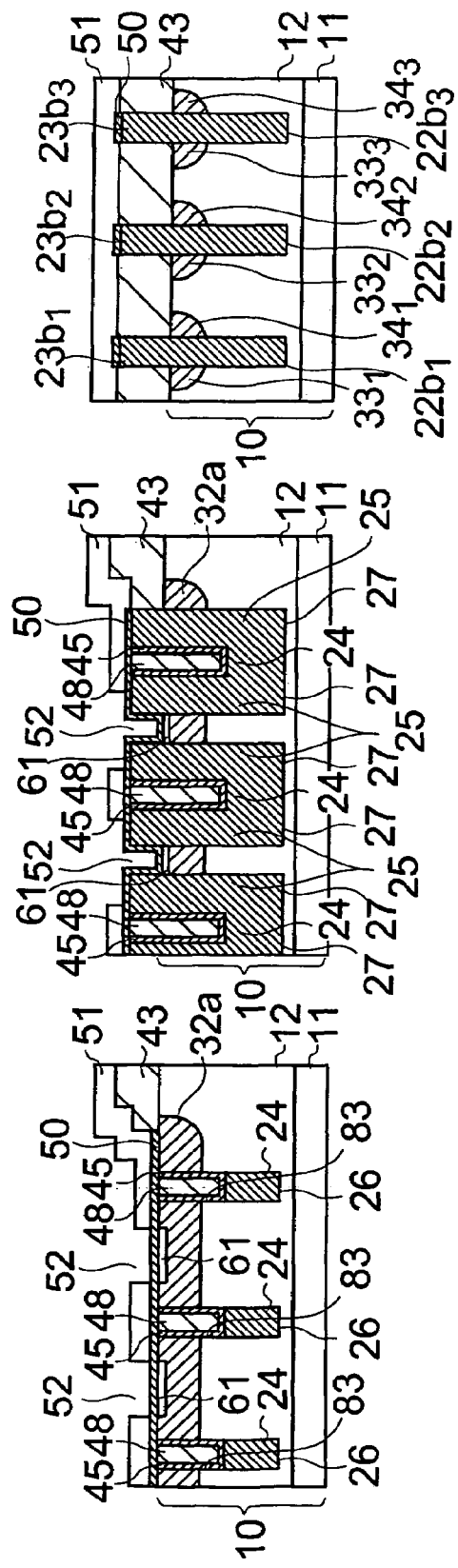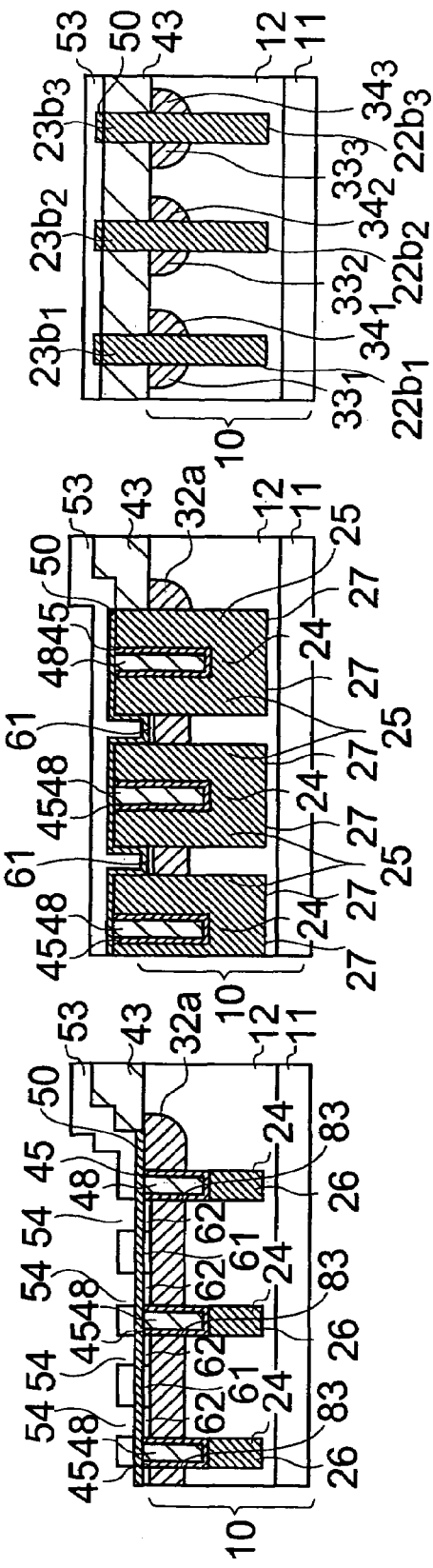

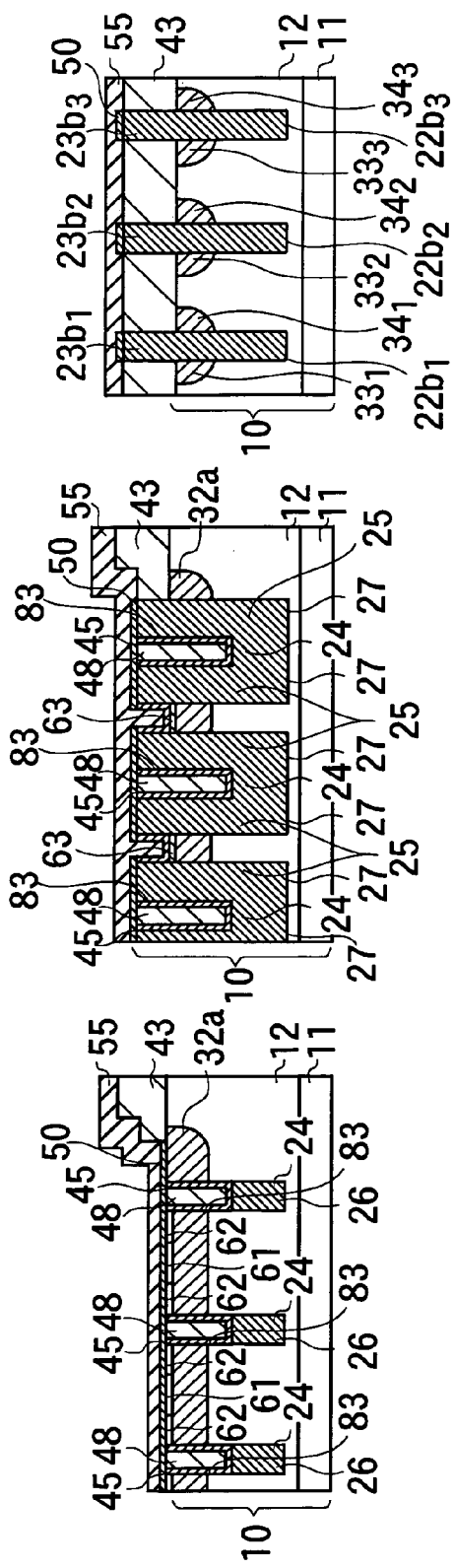
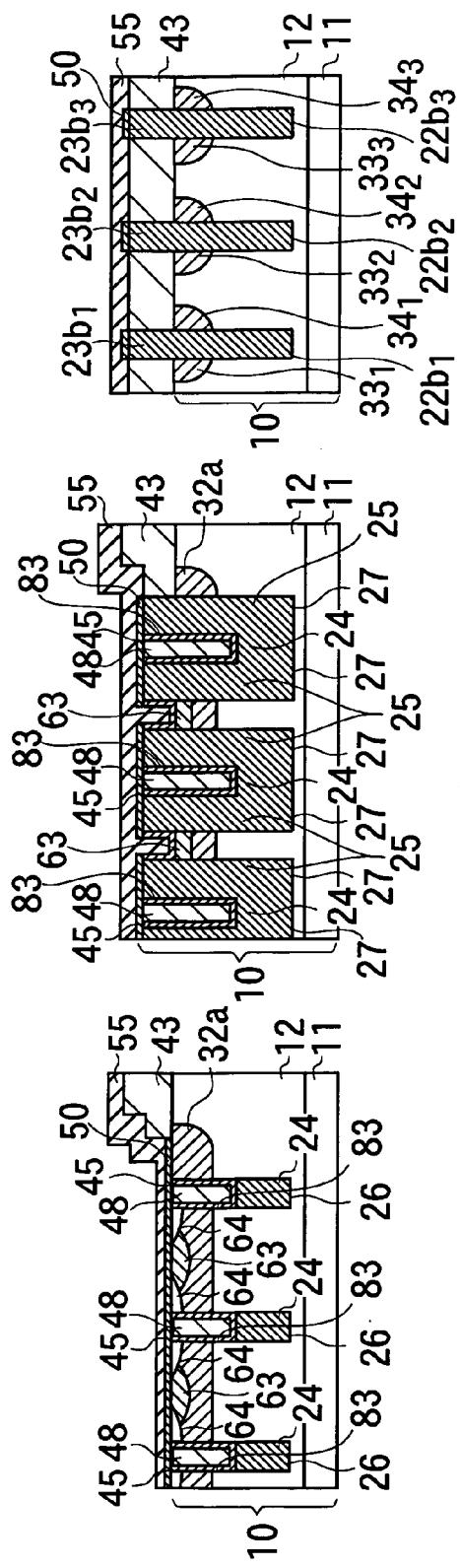

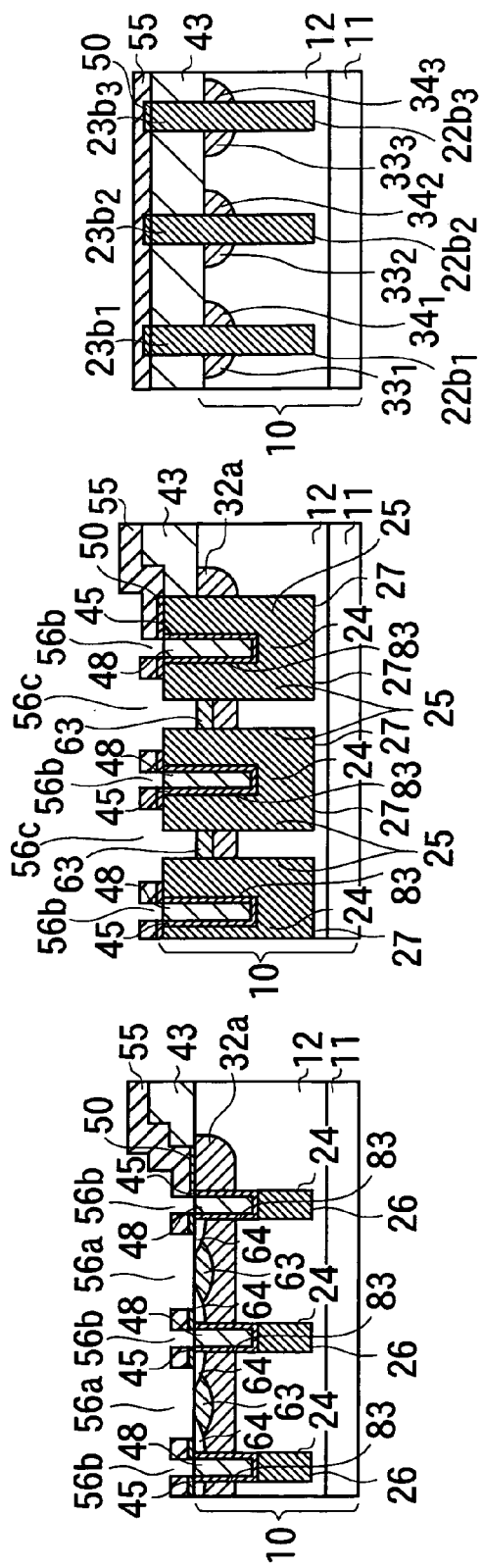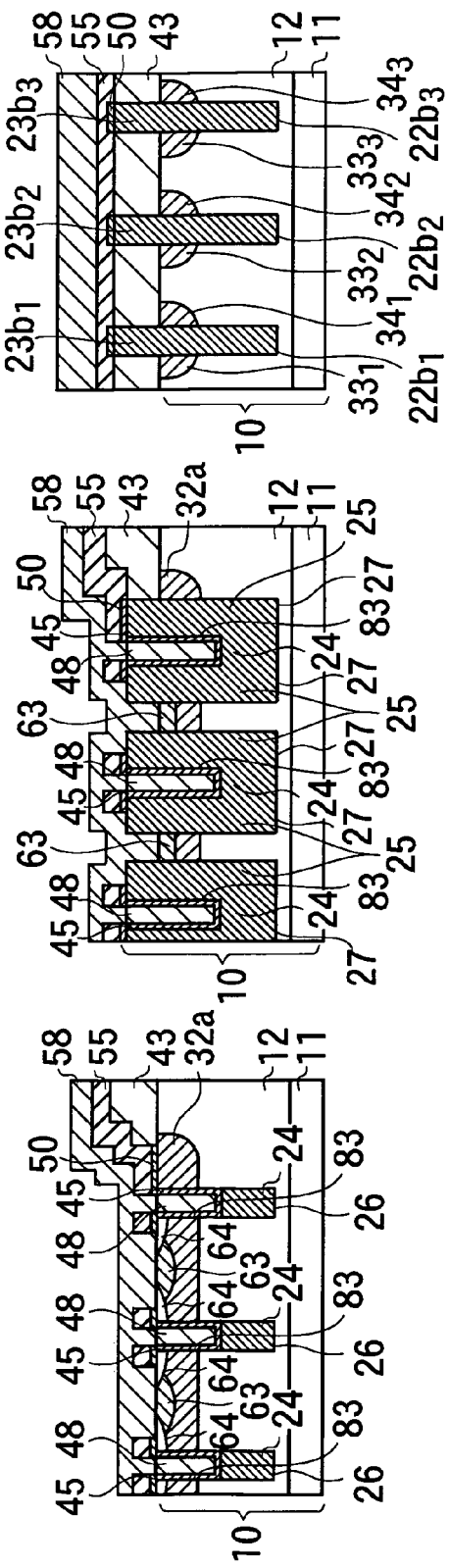

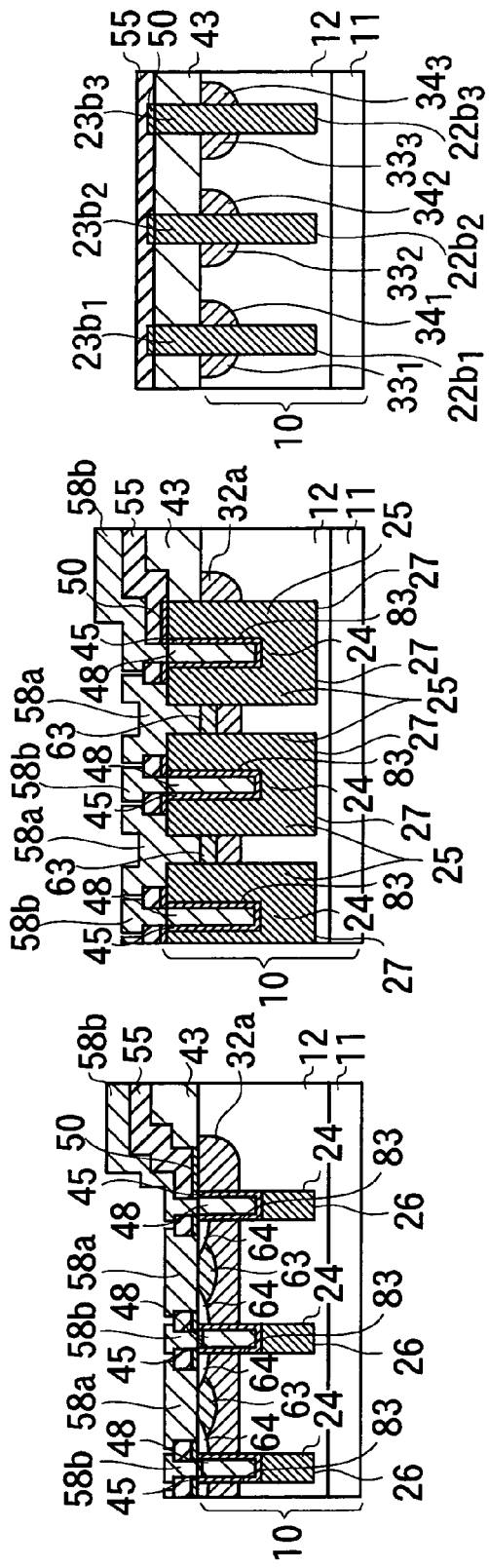
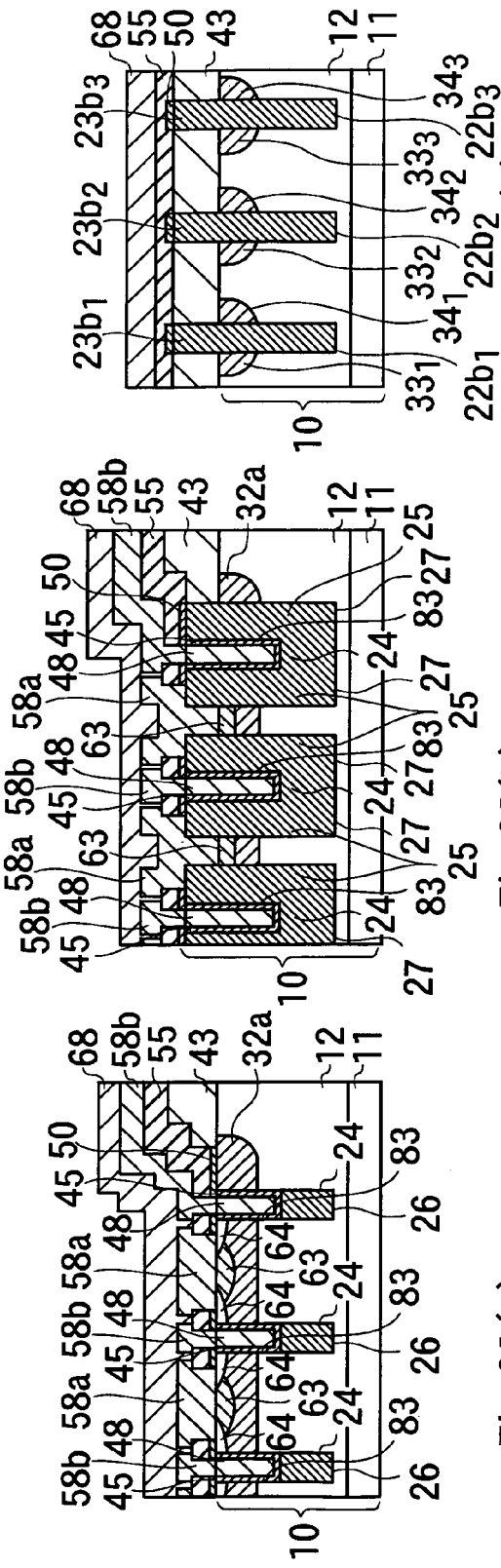
Fig. 24(a) Fig. 24(b) Fig. 24(c)
Fig. 25(a) Fig. 25(b) Fig. 25(c)

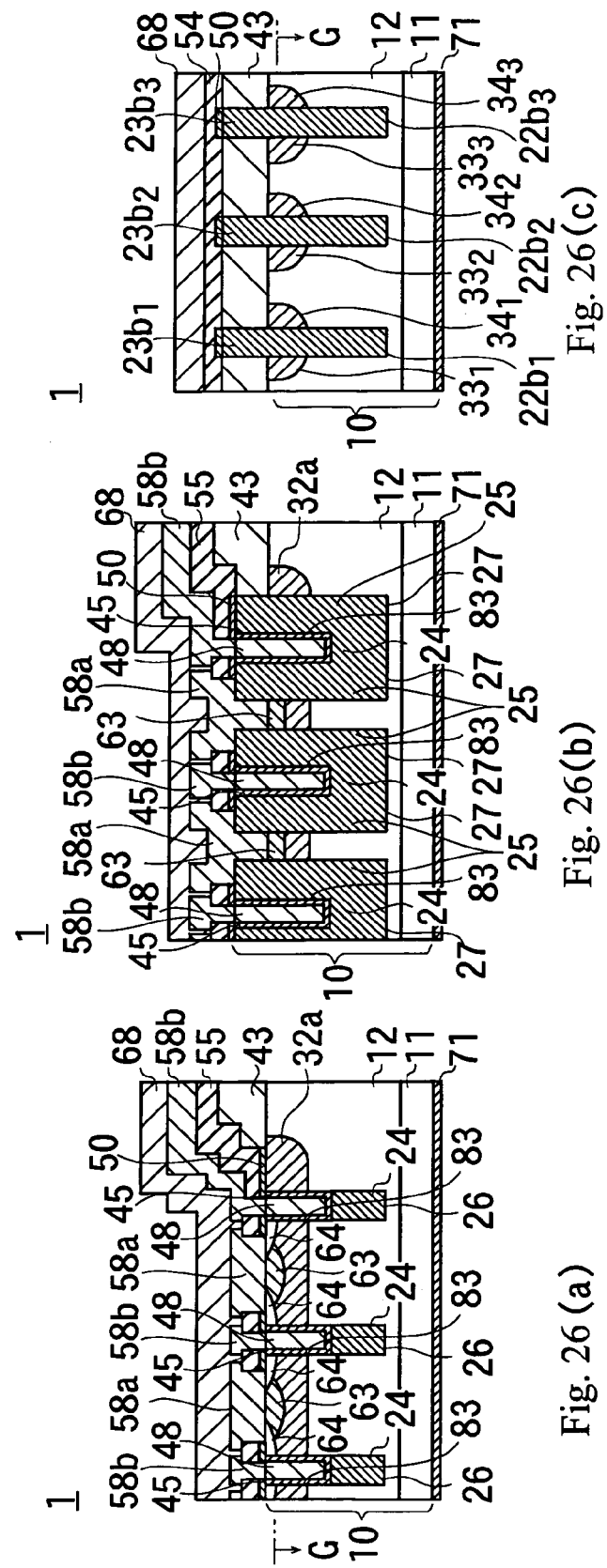

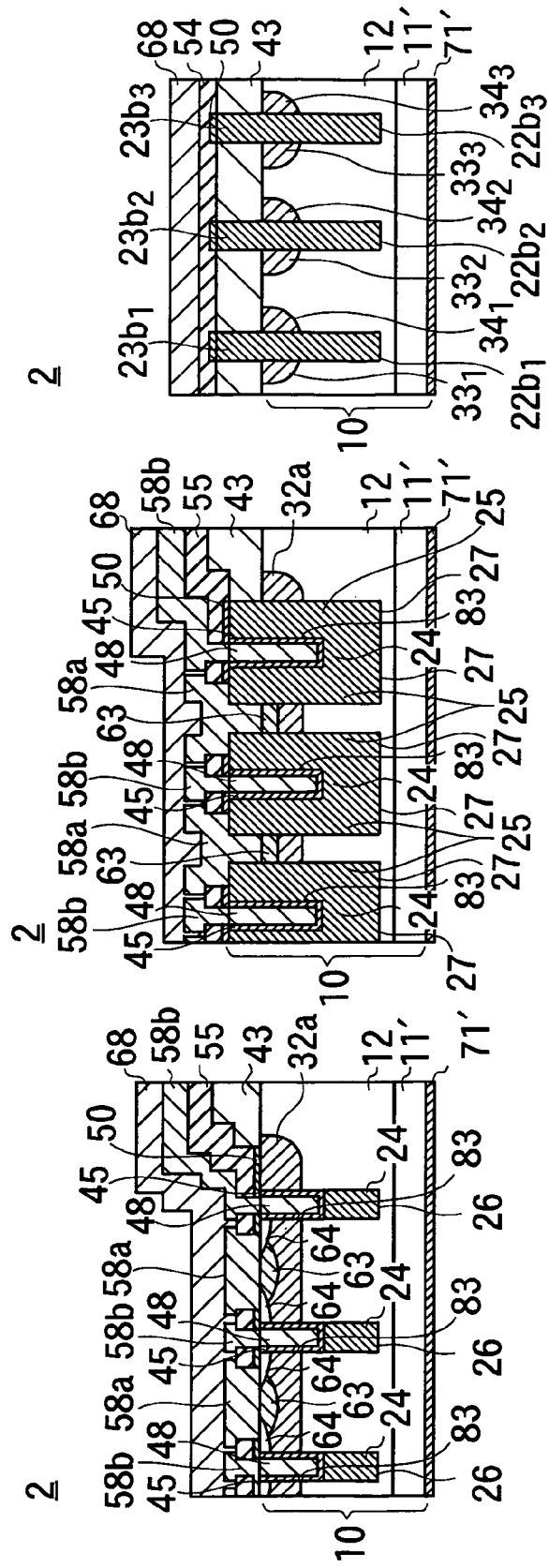

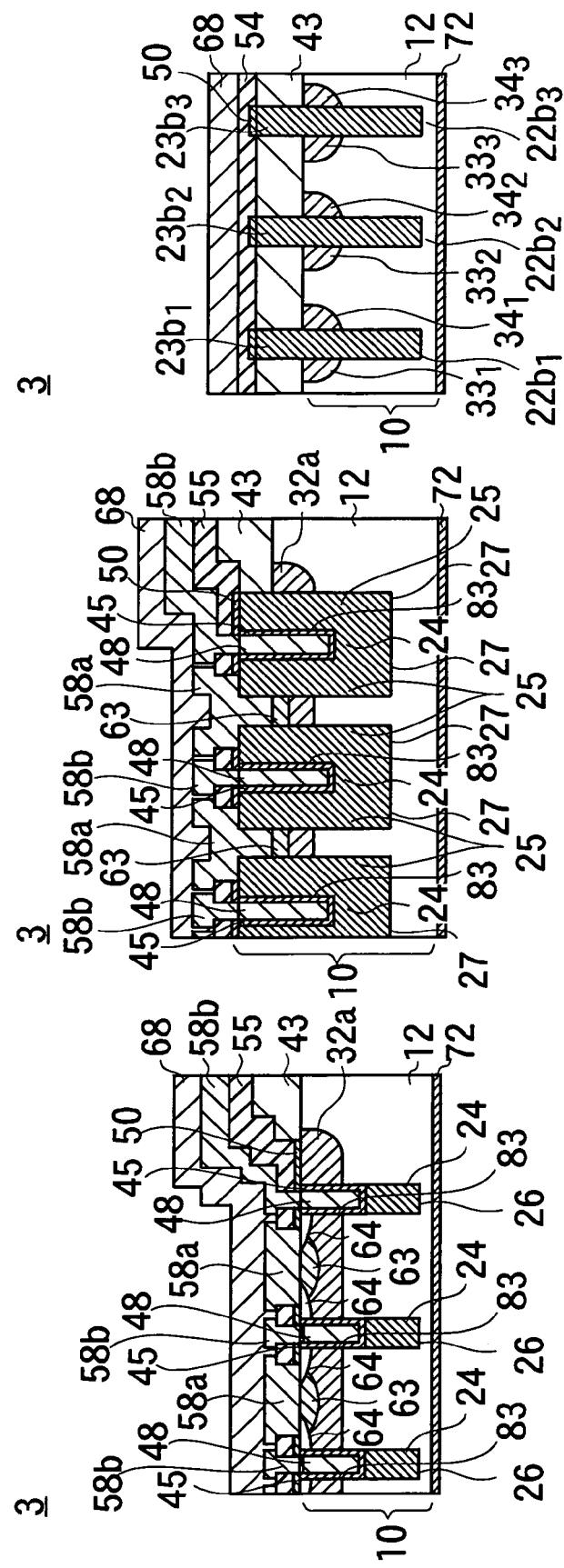

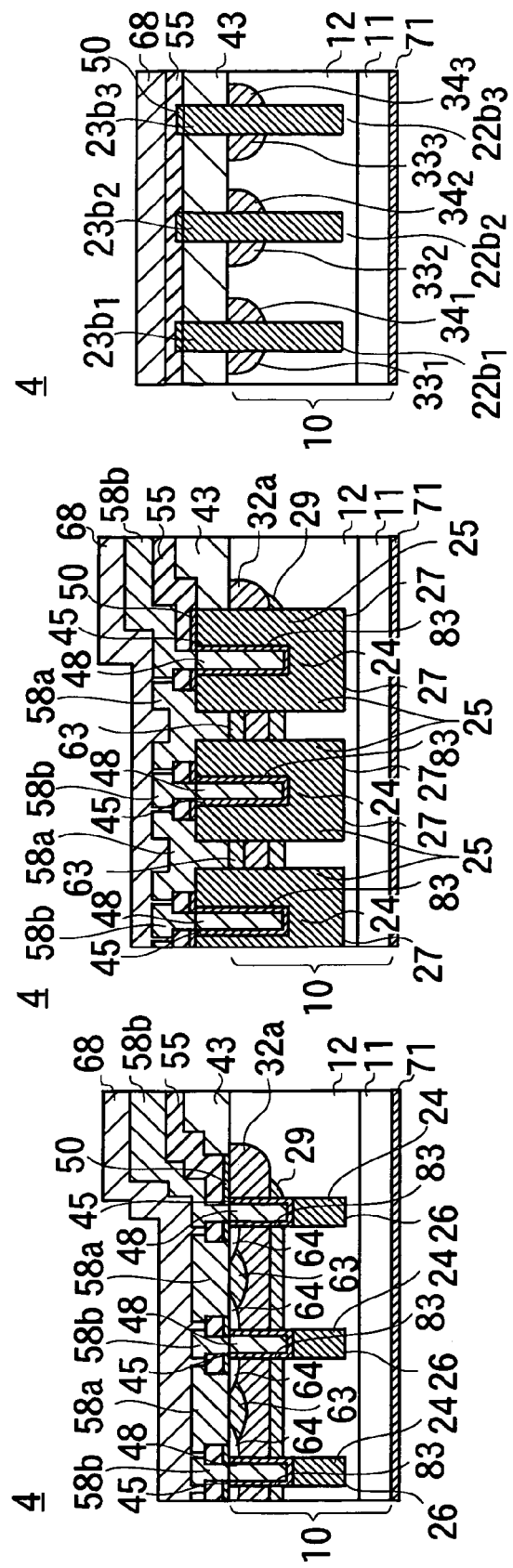

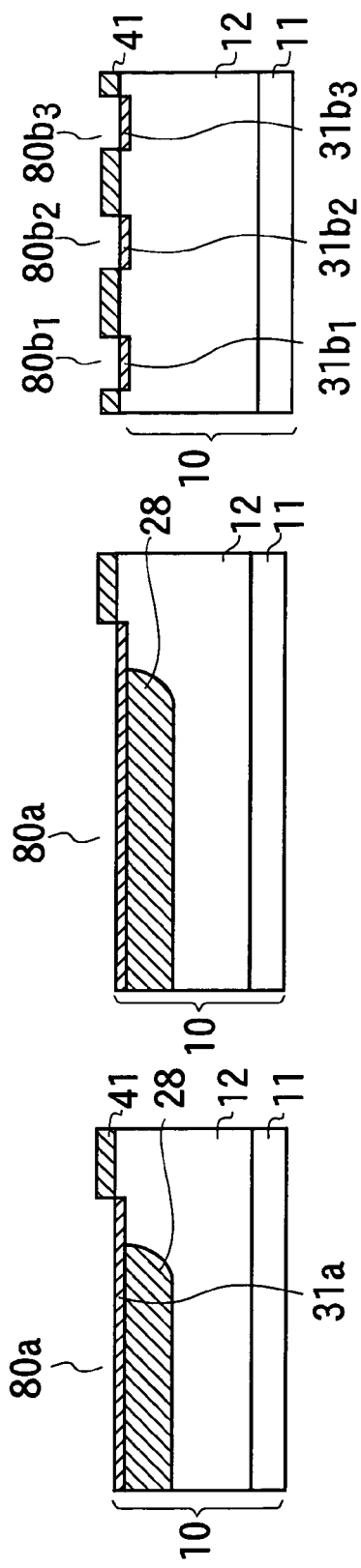
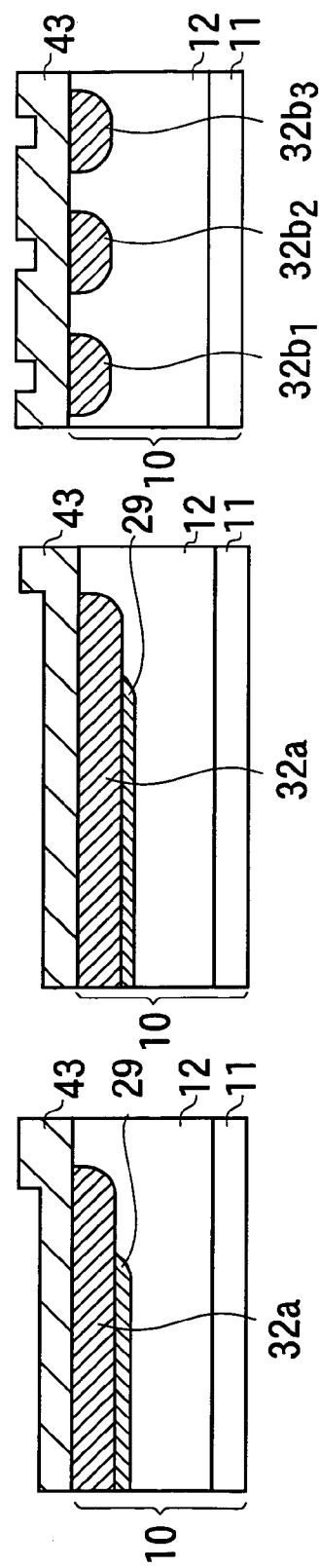

SEMICONDUCTOR DEVICE AND METHOD FOR MANUFACTURING THEREOF

This is a Continuation of International Application No. PCT/JP2005/004177 filed Mar. 10, 2005. The entire disclosure of the prior application is hereby incorporated by reference herein in its entirety.

BACKGROUND OF THE INVENTION

1. Field of the Invention

The present invention generally relates to semiconductor devices; and more particularly, to a semiconductor device having a semiconductor filler provided in grooves.

2. Discussion of the Relevant Art

FIG. 41 is a sectional view of a conventional transistor 102.

The transistor 102 is a trench-type power MOSFET and includes a semiconductor substrate 111 of silicon single crystal doped with a high concentration n$^+$ type impurity and a drain layer 112 including an n$^-$ type silicon epitaxial layer formed on the semiconductor substrate 111 by epitaxial growth.

The reference numeral 110 denotes a substrate to be processed having the semiconductor substrate 111 and the drain layer 112. The substrate to be processed 110 is subjected to semiconductor manufacturing process so that a p-type body layer 113 is formed on the inside surface of the drain layer 112 and a plurality of p$^+$ type Ohmic diffusion regions 116 and a plurality of n$^+$ type source diffusion regions 130 are formed in the vicinity of the inside surface of the body layer 113.

The substrate to be processed 110 has its surface etched into strip shapes between the source diffusion regions 130; and thus, narrow grooves 120 are formed.

At the inner circumferential surface of each of the narrow grooves 120, a gate insulating film 124 is formed, and polysilicon is filled within the narrow groove 120 while the gate insulating film keeps the polysilicon from contacting the substrate to be processed 110. The polysilicon forms a gate electrode plug 127.

The gate electrode plugs 127 in the narrow grooves 120 are connected with one another by a gate electrode film of a thin metal film that is not shown.

On the surfaces of the source diffusion region 130 and the Ohmic diffusion region 116, a source electrode film 137 of a thin metal film is formed. An interlayer insulating film 131 is formed on the narrow grooves 120, and the source electrode film 137 and the gate electrode plugs 127 are electrically insulated from one another by the interlayer insulating film 131.

On the back surface of the substrate to be processed 110 (i.e., on the surface of the semiconductor substrate 111), a drain electrode film 139 is formed.

When a positive voltage equal to or higher than the threshold voltage is applied to the gate electrode film while the source electrode film 137 is connected to the ground potential and a positive voltage is applied to the drain electrode film 139, an n-type inversion layer is formed at the interface between the gate insulating film 124 and the body layer 113. The inversion layer connects the source diffusion region 130 and the drain layer 112 and a current flow from the drain layer 112 to the source diffusion region 130 through the inversion layer. In this state, the transistor 102 conducts; and since there is no JFET region that would exist in a power MOSFET without such narrow grooves 120, the conduction resistance is small as compared to an ordinary power MOSFET.

When the potential of the gate electrode film is pulled to the potential of the source electrode film 137 from the conduction state, the inversion layer disappears and current no longer flows.

In this state, the pn junction between the body layer 113 and the drain layer 112 is reversely biased; and the avalanche breakdown voltage of the pn junction is equal to the withstand voltage of the transistor 102.

In general, the avalanche breakdown voltage of the pn junction varies depending on the shape of a depletion layer during reverse-biasing; and in the transistor 102 as described above, the electric field intensity in the depletion layer expanding in the drain layer 112 is not uniform so that the avalanche breakdown voltage is determined based on the part where the electric field is intensified, which lowers the withstand voltage.

A semiconductor device 103 having a structure as shown in FIG. 42 has been suggested, in which a conductive buried region 122 of a conductivity type different from that of the drain layer 112 is formed under the narrow groove 120 in an attempt to relax the electric field of the depletion layer expanding within the drain layer 112.

The buried region 122 is formed by making narrow grooves 120 having a large depth and then filling a filler by growth at the bottom and side walls of the narrow grooves 120, and the filler may be a single crystal or polycrystal of semiconductor.

However, when the buried region 122 is at a floating potential, the withstand voltage is not stable. When the withstand voltage was obtained by simulations, it was found that the withstand voltage was raised by short-circuiting between the buried region 122 and the source electrode film 137. Specific features for the purpose have been sought after.

Above-mentioned related art is disclosed in Japanese Patent Laid-Open Publication No. 2003-069017

SUMMARY OF THE INVENTION

The present invention is directed to a solution to the above-described disadvantages associated with the conventional techniques; and it is an object of the invention to provide a semiconductor device with high withstand voltage.

In order to solve the above-described problem and attain the above-noted object, the invention is a semiconductor device including a substrate to be processed, having a conductive layer of a first conductivity type, a base diffusion region of a second conductivity type formed on an inside surface of the conductive layer and an active groove formed in a position where the base diffusion region is provided in the conductive layer and a bottom surface of the active groove is deeper than a bottom surface of the base diffusion region. The active groove has a long and narrow main groove part and a sub groove part connected to a longitudinal side surface of the main groove part, a buried region of the second conductivity type whose upper part is lower than the base diffusion region provided on a bottom surface of the main groove part, a gate groove is made of a portion of the main groove part above the buried region, a gate insulating film is provided on a side surface of the gate groove, a conductive gate electrode plug in contact with the gate insulating film and electrically insulated from the buried region is provided in the gate groove, a source diffusion region of the first conductivity type is provided inside surface of the base diffusion region in a position where the source diffusion region is in contact with the gate insulating film and the source diffusion region is isolated from the conductive layer by the diffusion region, and an active groove filling region of the second conductivity type having an upper part thereof in contact with the base diffusion region and a lower part thereof in contact with the buried region is provided on the bottom surface of the sub groove part.

The invention is the semiconductor device, wherein an upper end of the active groove filling region is higher than the surface of the conductive layer.

The invention is the semiconductor device further including a source electrode film formed on a surface of the source diffusion region, the source electrode film being in contact with a surface of the active groove filling region.

The invention is the semiconductor device, wherein an impurity layer of the second conductivity type is formed by diffusion in a part of the surface of the active groove filling region in contact with the source electrode film.

The invention is the semiconductor device, wherein the source electrode film is in contact with the base diffusion region, and the active groove filling region is in contact with the base diffusion region.

The invention is the semiconductor device further including a plurality of ring-shaped guard grooves concentrically surrounding the active groove and separated from one another at predetermined intervals; and a guard groove filling region of the second conductivity type provided in the guard groove.

The invention is the semiconductor device further including a drain electrode film electrically connected with the conductive layer at a back surface of the substrate to be processed.

The invention is the semiconductor device, wherein a collector layer of the second conductivity type in contact with the conductive layer to form a pn junction and a collector electrode film electrically connected with the collector layer is provided at the back surface of the substrate to be processed.

The invention is the semiconductor device wherein a Schottky electrode film forming a Schottky junction with the conductive layer is provided at the back surface of the substrate to be processed.

The invention is a method of manufacturing a semiconductor device, wherein the semiconductor device includes a substrate to be processed, a conductive layer of a first conductivity type, a base diffusion region of a second conductivity type formed on an inside surface of the conductive layer, and an active groove formed in a position. The base diffusion region is provided in the conductive layer and a bottom surface of the active groove is deeper than a bottom surface of the base diffusion region. The active groove has a long and narrow main groove part and a sub groove part connected to a longitudinal side surface of the main groove part; and a buried region of the second conductivity type whose upper part is lower than the base diffusion region is provided on a bottom surface of the main groove part. A gate groove is made of a portion of the main groove part above the buried region; a gate insulating film is provided on a side surface of the gate groove, and a conductive gate electrode plug in contact with the gate insulating film and electrically insulated from the buried region is provided in the gate groove. A source diffusion region of the first conductivity type is provided inside surface of the base diffusion region in a position where the source diffusion region is in contact with the gate insulating film and the source diffusion region is isolated from the conductive layer by the base diffusion region; and an active groove filling region of the second conductivity type having an upper part thereof in contact with the base diffusion region and a lower part thereof in contact with the buried region is provided on the bottom surface of the sub groove part. The active groove is formed in the manner such that the base diffusion region is exposed at the upper side surface of the active groove and the conductive layer is exposed at the lower side surface after the base diffusion region is formed. After a semiconductor filler of the second conductivity type is grown in the active groove, etching is carried out to the surface of the semiconductor filler in the sub groove part through a mask film, the upper part of the semiconductor filler positioned in the main groove part is removed to a position lower than the bottom surface of the base diffusion region, and the remaining lower part forms the buried region, while the part of the main groove part where the semiconductor filler is removed forms the gate groove.

With this invention, a semiconductor device with high withstand voltage can be obtained. Also with this invention, a gate electrode film can be provided more easily, which reduces the parasitic capacitance and the resistance value.

BRIEF DESCRIPTION OF THE DRAWINGS

FIGS. 2(a), 2(b) and 2(c) are views for illustrating the process of manufacturing the semiconductor device according to the present invention (1).

FIGS. 3(a), 3(b) and 3(c) are views for illustrating the process of manufacturing the semiconductor device according to the present invention (2).

FIGS. 4(a), 4(b) and 4(c) are views for illustrating the process of manufacturing the semiconductor device according to the present invention (3).

FIGS. 5(a), 5(b) and 5(c) are views for illustrating the process of manufacturing the semiconductor device according to the present invention (4).

FIGS. 6(a), 6(b) and 6(c) are views for illustrating the process of manufacturing the semiconductor device according to the present invention (5).

FIGS. 7(a), 7(b) and 7(c) are views for illustrating the process of manufacturing the semiconductor device according to the present invention (6).

FIGS. 8(a), 8(b) and 8(c) are views for illustrating the process of manufacturing the semiconductor device according to the present invention (7).

FIGS. 9(a), 9(b) and 9(c) are views for illustrating the process of manufacturing the semiconductor device according to the present invention (8).

FIGS. 10(a), 10(b) and 10(c) are views for illustrating the process of manufacturing the semiconductor device according to the present invention (9).

FIGS. 11(a), 11(b) and 11(c) are views for illustrating the process of manufacturing the semiconductor device according to the present invention (10).

FIGS. 12(a), 12(b) and 12(c) are views for illustrating the process of manufacturing the semiconductor device according to the present invention (11).

FIGS. 13(a), 13(b) and 13(c) are views for illustrating the process of manufacturing the semiconductor device according to the present invention (12).

FIGS. 14(a), 14(b) and 14(c) are views for illustrating the process of manufacturing the semiconductor device according to the present invention (13).

FIGS. 15(a), 15(b) and 15(c) are views for illustrating the process of manufacturing the semiconductor device according to the present invention (14).

FIGS. 16(a), 16(b) and 16 (c) are views for illustrating the process of manufacturing the semiconductor device according to the present invention (15).

FIGS. 17(a), 17(b) and 17(c) are views for illustrating the process of manufacturing the semiconductor device according to the present invention (16).

FIGS. 18(a), 18(b) and 18(c) are views for illustrating the process of manufacturing the semiconductor device according to the present invention (17).

FIGS. 19(a), 19(b) and 19(c) are views for illustrating the process of manufacturing the semiconductor device according to the present invention (18).

FIGS. 20(a), 20(b) and 20(c) are views for illustrating the process of manufacturing the semiconductor device according to the present invention (19).

FIGS. 21(a), 21(b) and 21(c) are views for illustrating the process of manufacturing the semiconductor device according to the present invention (20).

FIGS. 22(a), 22(b) and 22(c) are views for illustrating the process of manufacturing the semiconductor device according to the present invention (21).

FIGS. 23(a), 23(b) and 23(c) are views for illustrating the process of manufacturing the semiconductor device according to the present invention (22).

FIGS. 24(a), 24(b) and 24(c) are views for illustrating the process of manufacturing the semiconductor device according to the present invention (23).

FIGS. 25(a), 25(b) and 25(c) are views for illustrating the process of manufacturing the semiconductor device according to the present invention (24).

FIGS. 26(a), 26(b) and 26(c) are views for illustrating the structure of a MOSFET according to the present invention.

FIGS. 27(a), 27(b) and 27(c) are sectional views for illustrating the structure of a pn-junction type IGBT according to the present invention.

FIGS. 28(a), 28(b) and 28(c) are sectional views for illustrating the structure of a Schottky type IGBT according to the present invention.

FIGS. 36(a) to 36(c) are sectional views for illustrating the diffusion structure of a semiconductor device having a low resistance region according to the present invention.

FIGS. 39(a) to 39(c) are sectional views for illustrating the process of manufacturing the device (3).

FIGS. 40(a) to 40(c) are sectional views for illustrating the process of manufacturing the device (4).

DETAILED DESCRIPTION OF THE PREFERRED EMBODIMENTS

In the following description of embodiments, one of p-type and n-type is referred to as a first conductivity type and the other as a second conductivity type. Therefore, when the first conductivity type is n-type, the second conductivity is p-type, while conversely when the first conductivity type is p-type, the second conductivity type is n-type, and both cases are covered by the invention.

Figure 1:
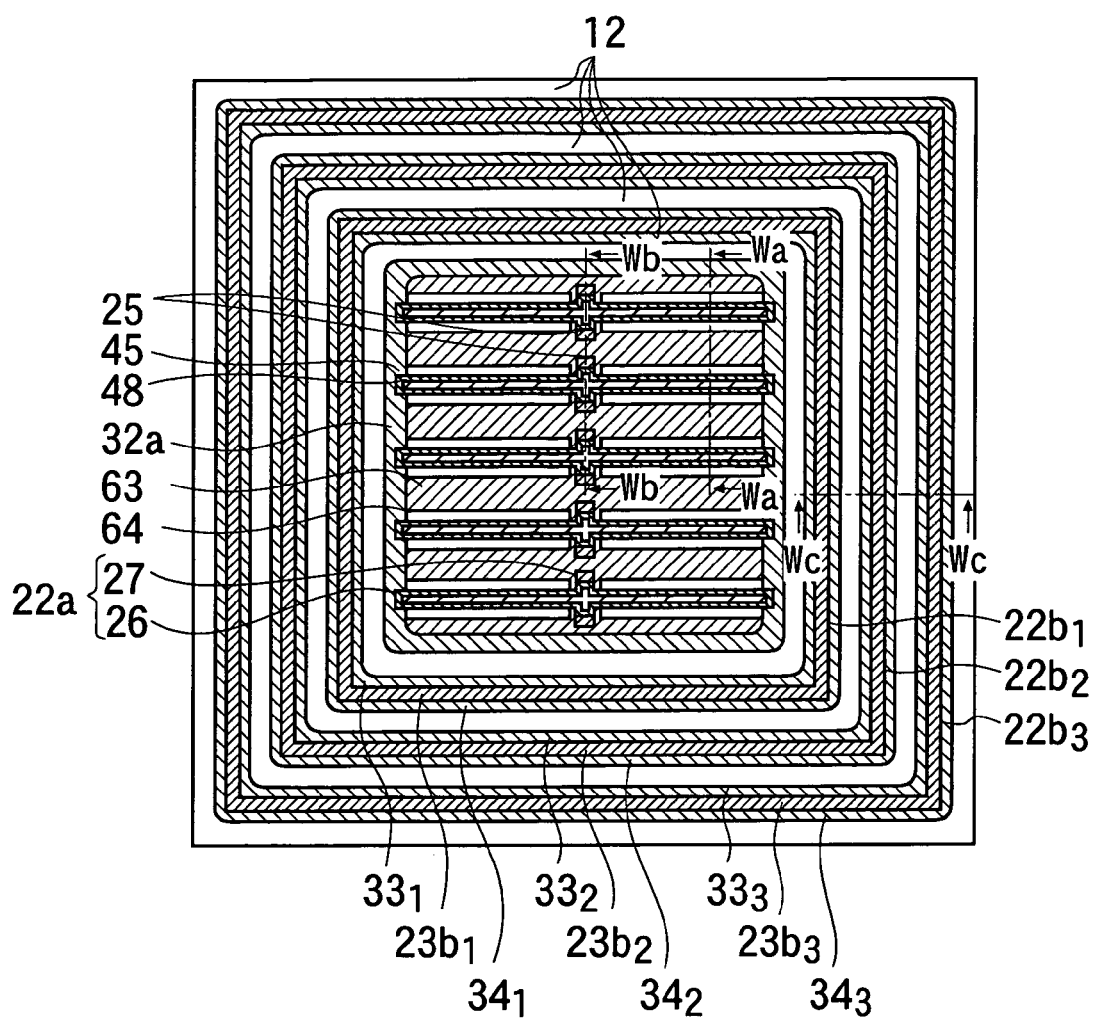
FIG. 1 is a plan view showing the diffusion structure of a semiconductor device according to one embodiment of the invention and a sectional view taken along line G-G in FIG. 26.

The reference numeral 1 in FIG. 1 denotes a semiconductor device according to a first embodiment of the invention. FIG. 1 is a plan view for illustrating the diffusion structure of the semiconductor device 1.

A base diffusion region 32a and a source diffusion region 64 described below are provided in an active region in the center of the semiconductor device 1, and in a withstand voltage region near and surrounding the active region, guard groove filling regions $23b_1$ to $23_3$, inner circumferential auxiliary diffusion regions $33_1$ to $33_3$, and outer circumferential auxiliary diffusion regions $34_1$ to $34_3$ are provided.

FIGS. 26(a) and 26(b) are sectional views of the active region taken along the lines Wa-Wa and Wb-Wb in FIG. 1. FIG. 26(c) is a sectional view of the withstand voltage region taken along Wc-Wc in FIG. 1. FIG. 1 is a sectional view taken along the line G-G in FIGS. 26(a) to 26(c).

Referring to FIG. 1 and FIGS. 26(a) to 26(c), the semiconductor device 1 includes a semiconductor single crystal layer 11 and a conductive layer 12 in contact with the semiconductor single crystal layer 11.

The semiconductor single crystal layer 11 is made of silicon single crystal of a first conductivity type, and the conductive layer 12 is made of a silicon epitaxial layer of the first conductivity type epitaxially grown on the surface of the semiconductor single crystal layer 11. The conductive layer 12 has a concentration lower than that of the semiconductor single crystal layer 11 and allows a depletion layer to easily expand.

In the conductive layer 12, at the inside surface positioned in the active region, a base diffusion region 32a of a second conductivity type is formed in a position not as deep as to reach the semiconductor single crystal layer 11.

The reference numeral 10 in FIGS. 26(a) to 26(c) denotes a substrate to be processed, and the substrate includes the conductive layer 12 and a diffusion layer such as the base diffusion region 32a.

As shown in FIG. 1, the two-dimensional shape of the base diffusion region 32a is a square having its four corners rounded. A plurality of active grooves 22a are provided at equal intervals and parallel to one another in a region on a side that is inner than the edge of the square.

Each of the active grooves 22a includes a long and narrow main groove part 26 and a sub groove part 27 connected to the main groove part 26 at the center of the longitudinal side surface. Each of the active grooves 22a is provided on a side that is inner than the edge of the base diffusion region 32a so that they do not stick out from the base diffusion region 32a.

As shown in FIGS. 26(a) and 26(b), a buried region 24 of the second conductivity type made of the second conductivity type semiconductor single crystal (silicon single crystal in this example) is provided on the bottom surface of the main groove 26 in each of the active grooves 22a. The buried region 24 has a height lower than the bottom surface of the base diffusion region 32a and is not in contact with the base diffusion region 32a.

If the part of the main groove part 26 above the base diffusion region 32a serves as a gate groove 83, a gate insulating film 45 is provided on the side surface of the gate groove 83, and a gate electrode plug 48 is provided in the region surrounded by the gate insulating film 45. The gate electrode plug 48 is insulated from the buried region 24, the base diffusion region 32a, the source diffusion region 64, the conductive layer 12, and the active groove filling region 25.

An active groove filling region 25 of the second conductivity type, which is made of the same material as that of the buried region, is formed on the bottom surface of the sub groove part 27. The upper part of the active groove filling region 25 is higher than at least the bottom surface of the base diffusion region 32a and in contact with the base diffusion region 32a. In this example, the upper end of the active groove filling region 25 is higher than the surface of the conductive layer 12; i.e., the surface of the base diffusion region 32a.

A long and narrow source diffusion region 64 of the first conductivity type is arranged along the longitudinal side of the main groove part 26 of each of the active grooves 22a. The source diffusion region 64 is in contact with the gate insulating film 45. The source diffusion region 64 is shallower than the base diffusion region 32a and is kept from sticking out from the outer circumference of the base diffusion region 32a in the lateral direction. Therefore, the source diffusion region 64 is electrically isolated from the conductive layer 12.

An Ohmic diffusion region 63 of the second conductivity type is provided between adjacent source diffusion regions 64.

The Ohmic diffusion region 63 has a surface concentration higher than that of the base diffusion region 32a and is in Ohmic contact with a metal (such as, aluminum).

In the withstand voltage region, a plurality of (three in this example) square ring-shaped guard grooves $22b_1$ to $22b_3$ are concentrically formed, and the base diffusion region 32a is provided on the inner side than the innermost guard groove $22b_1$. Therefore, the base diffusion region 32a is concentrically surrounded by the guard grooves $22b_1$ to $22b_3$.

Each of the guard grooves $22b_1$ to $22b_3$ has a bottom surface positioned inside the conductive layer 12 and an upper opening positioned in the field insulating film 43 on the surface of the conductive layer 12.

On the bottom surfaces of the guard grooves $22b_1$ to $22b_3$, guard groove filling regions $23b_1$ to $23b_3$ of the second conductivity type made of the same material as that of the buried region 24 and the active groove filling region 25 are provided.

Inner circumferential auxiliary diffusion regions $33_1$ to $33_3$ of the second conductivity type and outer circumferential auxiliary diffusion regions $34_1$ to $34_3$ of the second conductivity type are provided in the vicinity of the surface inside the conductive layer 12 on the inner and outer circumferential sides of the guard groove filling regions $23b_1$ to $23b_3$ and in contact with the entire circumferences of the guard groove filling regions $23b_1$ to $23b_3$. The auxiliary diffusion regions $33_1$ to $33_3$ and $34_1$ to $34_3$ on the inner and outer circumferential sides are in square ring shapes each having their four corners rounded.

The inner circumferential auxiliary diffusion regions $33_1$ to $33_3$ and the outer circumferential auxiliary diffusion regions $34_1$ to $34_3$ are each in contact with one of the guard groove filling regions $23b_1$ to $23b_3$ and kept from contacting any other of the inner circumferential auxiliary diffusion regions $33_1$ to $33_3$ and the outer circumferential auxiliary diffusion regions $34_1$ to $34_3$. Therefore, the guard groove filling regions $23b_1$ to $23b_3$ are electrically isolated from one another.

The auxiliary diffusion regions $33_1$ to $33_3$ and $34_1$ to $34_3$ are formed together with the base diffusion region 32a and therefore have a depth equal to that of the base diffusion region 32a.

The guard groove filling regions $23b_1$ to $23b_3$ have shapes the same as those of guard grooves $22b_1$ to $22b_3$, respectively. Each of four corners of the guard groove filling regions $23b_1$ to $23b_3$ and the guard grooves $22b_1$ to $22b_3$ is at a right angle (90 deg.).

Since the inner circumferential auxiliary diffusion regions $33_1$ to $33_3$ and outer circumferential auxiliary diffusion regions $34_1$ to $34_3$ are provided at the upper parts of the guard groove filling regions $23b_1$ to $23b_3$, at least the upper parts of the four corners of each of the guard groove filling regions $23b_1$ to $23b_3$ do not form a pn junction with the conductive layer 12; and the inner circumferential auxiliary diffusion regions $33_1$ to $33_3$ and outer circumferential auxiliary diffusion regions $34_1$ to $34_3$ and the conducive layer 12 form pn junctions.

The corner parts of the outer circumferential auxiliary diffusion regions $34_1$ to $34_3$ have a quadrant shape with a radius that is not less than 0.7 μm; and therefore, the pn junctions at the upper parts of the guard groove filling regions $23b_1$ to $23b_3$ are close to planar junctions rather than cylindrical junctions.

The inner circumferential auxiliary diffusion region $33_1$ connected to the innermost circumferential guard groove filling region $23b_1$ is a prescribed distance apart from the base diffusion region 32a so that the innermost circumferential guard groove filling region $23b_1$ is electrically isolated from the base diffusion region 32a.

The base diffusion region 32a, the source diffusion region 64, and the conductive layer 12 are connected to external terminals, while the guard groove filling regions $23b_1$ to $23b_3$, and the inner circumferential auxiliary diffusion regions $33_1$ to $33_3$ and outer circumferential auxiliary diffusion regions $34_1$ to $34_3$ are not connected to external terminals. If a voltage is applied to the base diffusion region 32a and the conductive layer 12, the guard groove filling regions $23b_1$ to $23b_3$ and the inner circumferential auxiliary diffusion regions $33_1$ to $33_3$ and outer circumferential auxiliary diffusion regions and $34_1$ to $34_3$ are each held at a floating potential.

Note that the innermost circumferential guard groove filling region $23b_1$ may be connected to the base diffusion region $32a$. In this case, the innermost circumferential guard groove filling region $23b_1$ is pulled to the same potential as that of the base diffusion region $32a$, while the other guard groove filling regions $23b_2$ and $23b_3$ are held at a floating potential.

When the semiconductor single crystal layer 11 and the conductive layer 12 are made of silicon single crystal, the surfaces of the semiconductor single crystal layer 11 and the conductive layer 12 are in the {1 0 0} orientation. In this specification, {1 0 0} includes all the following surface orientations.

(1 0 0), (0 1 0), (0 0 1), ($\bar{1}$ 0 0), (0 $\bar{1}$ 0), (0 0 $\bar{1}$)    Formula 1

The two-dimensional shape of each of the guard grooves $22b_1$ to $22b_3$ is a square or rectangular ring shape; and adjacent two sides of the guard grooves $22b_1$ to $22b_3$ are arranged parallel to one another.

The direction of the sides of each of the guard grooves $22b_1$ to $22b_3$ is aligned to the plane orientation of the conductive layer 12 so that the {1 0 0} plane of the conductive layer 12 is exposed on the inner or outer circumferential side surfaces of the rings of the guard grooves $22b_1$ to $22b_3$.

The active grooves $22a$ are each in a long and narrow rectangular shape, parallel to one another and have their lengthwise direction arranged parallel to two parallel sides of the guard grooves $22b_1$ to $22b_3$. The {1 0 0} plane of the conductive layer 12 is exposed on the four side surfaces of each of the active grooves $22a$.

The bottom surfaces of the guard grooves $22b_1$ to $22b_3$ and the active groove $22a$ are arranged parallel to the surface of the conductive layer 12 and therefore in the {1 0 0} plane orientation.

In this way, the surface of the conductive layer 12 exposed in the guard grooves $22b_1$ to $22b_3$ and the active groove $22a$ is equally in the same {1 0 0} plane orientation; and therefore, when a silicon single crystal is grown inside the active groove $22a$ and the guard groove $22b$, the silicon single crystal grows uniformly.

The active groove filling region 25, the guard groove filling region $23b$, and the buried region 24 are made of a silicon single crystal epitaxially grown inside the active groove $22a$ and the guard grooves $22b_1$ to $22b_3$. Therefore, if the growth is homogeneous, no void is generated inside.

The process of manufacturing the semiconductor device 1 mentioned above will now be described.

In each of FIGS. 2 to 26, (a) is a cross sectional view of the main groove part 26 in the active groove $22a$, (b) is a cross sectional view of the sub groove part 27, and (c) is a cross sectional view of the guard grooves $22b_1$ to $22b_3$.

Referring to FIGS. 2($a$) to 2($c$), the reference numeral 10 denotes a substrate to be processed. As described above, the substrate to be processed 10 has a semiconductor single crystal layer 11 made of a silicon single crystal of a first conductivity type and a conductive layer 12 of silicon of the first conductivity type epitaxially grown on the semiconductor single crystal layer 11.

The substrate to be processed 10 is a wafer having a diameter in the range from several inches to ten and several inches, a plurality of identical patterns are formed in a single such wafer. Each pattern goes through the following process and forms a single semiconductor device 1. The following description is about the process of manufacturing one such semiconductor device 1.

A first insulating film of a silicon oxide film formed by thermal oxidation is provided on the conductive layer 12, and then the first insulating film is patterned to form a first mask layer 41. The first mask layer 41 has a square or rectangular base diffusion opening $80a$ and a plurality of (three in this example) square ring-shaped auxiliary diffusion openings $80b_1$ to $80b_3$.

The auxiliary diffusion openings $80b_1$ to $80b_3$ are provided to concentrically surround the base diffusion opening $80a$ provided in the center position. A surface of the conductive layer 12 is exposed at the bottom surfaces of the base diffusion opening $80a$ and the auxiliary diffusion openings $80b_1$ to $80b_3$.

The four corners of the base diffusion opening $80a$ and the four corners on the inner and outer circumferences of the auxiliary diffusion openings $80b_1$ to $80b_3$ are not at right angles, but in a quadrant shape with a radius that is not less than 0.7 μm.

Then, an impurity of the second conductivity type is irradiated on the surface of the substrate to be processed 10 on the side where the conductive layer 12 is formed, the first mask layer 41 serves as a shield (mask), and high concentration impurity layers $31a$ and $31b_1$ to $31b_3$ of the second conductivity type are formed on the inner surface of the conductive layer 12 at the bottom surfaces of the openings $80a$ and $80b_1$ to $80b_3$, respectively, as shown in FIGS. 3($a$) to 3($c$).

Then, when the high concentration impurity layers $31a$ and $31b_1$ to $31b_3$ (the second conductivity type impurity included in them) are diffused by thermal treatment, a base diffusion region $32a$ is formed at the bottom surface of the base diffusion opening $80a$ and auxiliary diffusion regions $32b_1$ to $32b_3$ are formed at the bottom surfaces of the auxiliary diffusion openings $80b_1$ to $80b_3$ as shown in FIGS. 4($a$) to 4($c$). The base diffusion region $32a$ and the auxiliary diffusion regions $32b_1$ to $32b_3$ are of the second conductivity type.

When the base diffusion region $32a$ and the auxiliary diffusion regions $32b_1$ to $32b_3$ are formed, the thermal treatment therefore causes a thin thermal oxide film to form on the surface of the conductive layer 12.

The reference numeral 43 in FIGS. 4($a$) to 4($c$) denotes a field insulating film including the thin thermal oxide film and the first mask layer 41 in an integrated form.

Figure 29:
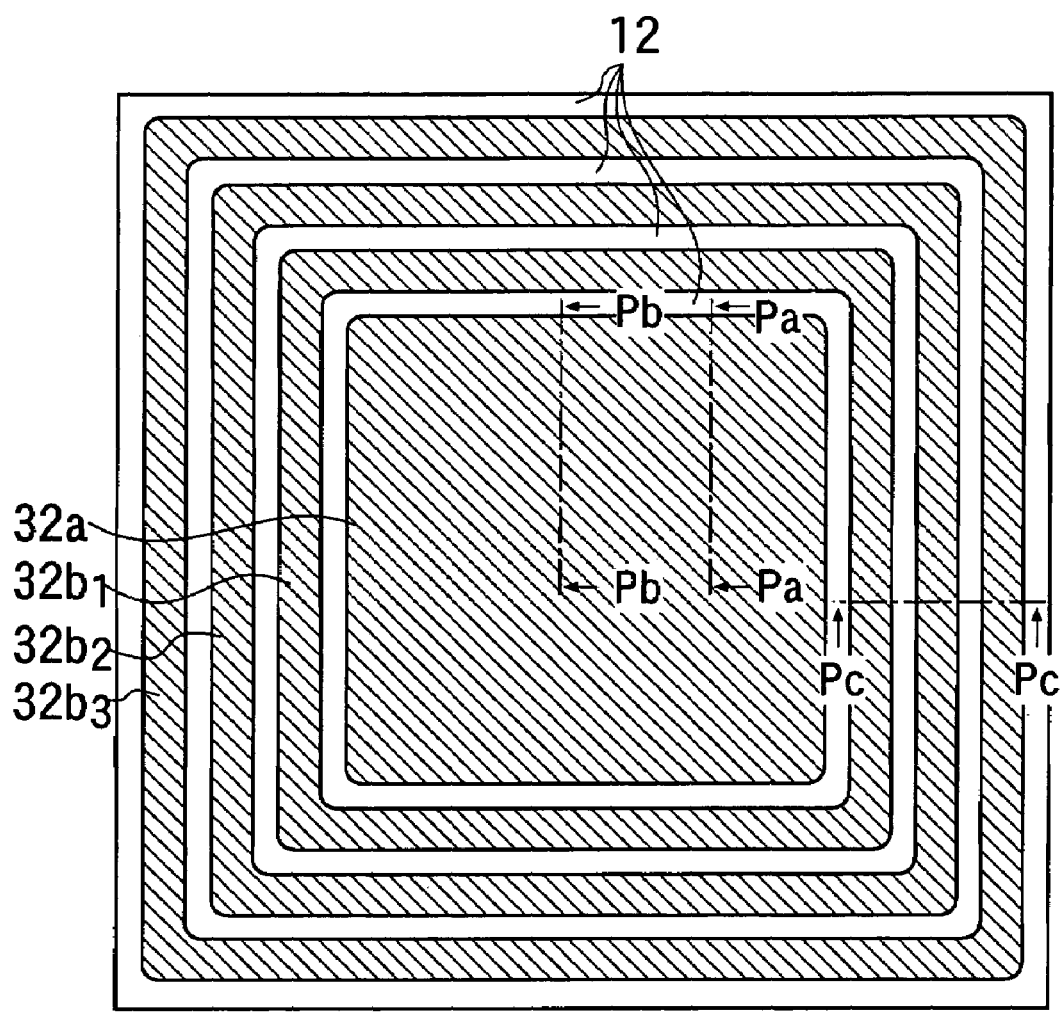
FIG. 29 is a plan view showing the diffusion structure of the semiconductor device according to the present invention and a sectional view taken along the line A-A in FIGS. 4(a) to 4(c).

FIG. 29 is a sectional view taken along the line A-A in FIGS. 4($a$) to 4($c$). The four corners of the base diffusion region $32a$ and the four corners at the outer and inner circumferences of the auxiliary diffusion regions $32b_1$ to $32b_3$ are in conformity with the shapes of the base diffusion opening $80a$ and the auxiliary diffusion openings $80b_1$ to $80b_3$ and in a quadrant shape with a radius that is 0.7 μm or more.

FIGS. 4($a$) to 4($c$) correspond to sectional views taken along the lines Pa-Pa, Pb-Pb, and Pc-Pc in FIG. 29, respectively.

Then, the field insulating film 43 is patterned, and as shown in FIGS. 5($a$) to 5($c$), a plurality of active groove window openings $81a$ are formed on the base diffusion region $32a$, and guard groove window openings $81b_1$ to $81b_3$ are formed in the widthwise center of the auxiliary diffusion regions $32b_1$ to $32b_3$, respectively. Each of the guard groove window openings $81b_1$ to $81b_3$ has a ring shape.

The active groove window opening $81a$ has a long and narrow rectangular part and a square part positioned approximately in the longitudinal center of the long and narrow rectangular part and connected to the rectangular part. The active groove window openings 81a are each provided on a side that is inner than the edge of the base diffusion region 32a. Therefore, the surface of the base diffusion region 32a is exposed at the bottom surface of each of the active groove window openings 81a, and the surface of the conductive layer 12 is not exposed.

The active groove window openings 81a are arranged parallel to one another in the longitudinal direction and parallel or orthogonal to the edge of the base diffusion region 32a.

The rings of the guard groove window openings $81b_1$ to $81b_3$ are in a square shape, and the four sides forming each ring are orthogonal to each other, and their four corners are not rounded. The widths of the guard groove window openings $81b_1$ to $81b_3$ are narrower than those of the auxiliary diffusion regions $32b_1$ to $32b_3$ and positioned in the widthwise center of the auxiliary diffusion regions $32b_1$ to $32b_3$. The surfaces of the auxiliary diffusion regions $32b_1$ to $32b_3$ are exposed at the bottom surfaces of the guard groove window openings $81b_1$ to $81b_3$.

The auxiliary diffusion regions $32b_1$ to $32b_3$ lie off from both sides of the guard groove window openings $81b_1$ to $81b_3$ and the surface of the conductive layer 12 is not exposed at the bottom surfaces of the guard groove window openings $81b_1$ to $81b_3$.

Then, using the field insulating film 43 as a mask, the semiconductor material that forms the substrate to be processed 10 exposed at the bottom surfaces of the active groove window opening 81a and the guard groove window openings $81b_1$ to $81b_3$ is dry-etched. Then, active grooves 22a and guard grooves $22b_1$ to $22b_3$ are formed, respectively, as shown in FIGS. 6(a) to 6(c).

The active grooves 22a and the guard grooves $22b_1$ to $22b_3$ have the same depth, and their bottom surfaces are provided between the bottoms of the base diffusion region 32a and the auxiliary diffusion regions $32b_1$ to $32b_3$ and the surface of the semiconductor single crystal layer 11 by controlling the etching time.

The sectional shapes of the active grooves 22a and the guard grooves 22b have a long and narrow rectangular shape with a depth that is larger than the width.

The active groove window opening 81a forms the upper part of the active groove 22a, and the lower part of the active groove 22a is made of a groove formed in the substrate to be processed 10. Similarly, the upper parts of the guard grooves $22b_1$ to $22b_3$ are made of the guard groove window openings $81b_1$ to $81b_3$, and the lower part is made of grooves formed in the substrate to be processed 10.

Therefore, at the upper part of the inner circumferences of the active groove 22a and the guard grooves $22b_1$ to $22b_3$, the field insulating film 43 is exposed. Since the bottom of each groove is positioned in the conductive layer 12, the conductive layer 12 is exposed at the inner circumference of the lower end. In the intermediate area between them, the base diffusion region 32a and the auxiliary diffusion regions $32b_1$ to $32b_3$ are exposed.

The depths of the guard grooves $22b_1$ to $22b_3$ are larger than those of the auxiliary diffusion regions $32b_1$ to $32b_3$; and therefore, the auxiliary diffusion regions $32b_1$ to $32b_3$ are separated to inner circumferential auxiliary diffusion regions $33_1$ to $33_3$ and outer circumferential auxiliary diffusion regions $34_1$ to $34_3$ by the guard grooves $22b_1$ to $22b_3$.

The active groove 22a is positioned on a side that is inner than the edge of the base diffusion region 32a, and the base diffusion region 32a is not separated by the active groove 22a.

Figure 30:
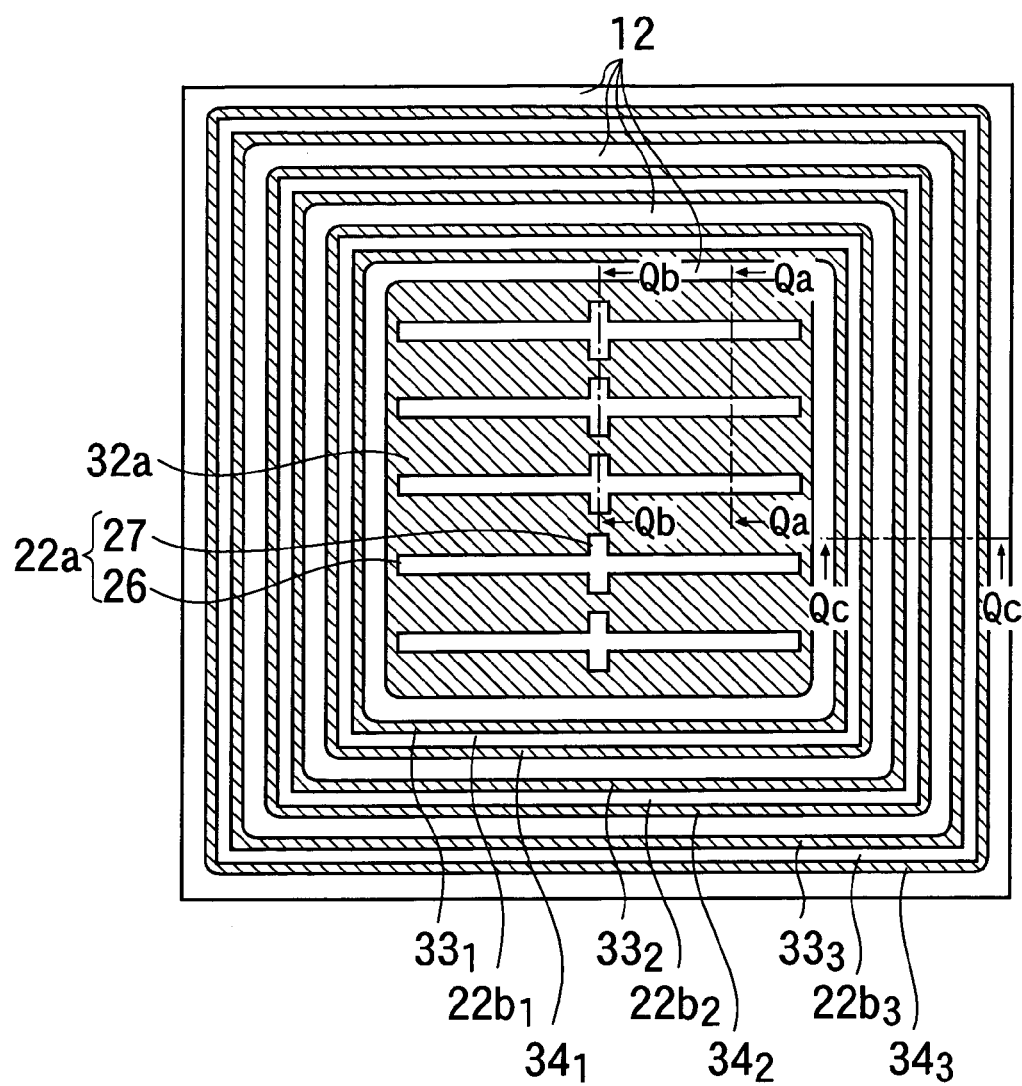
FIG. 30 is a plan view showing the diffusion structure of the semiconductor device according to the present invention and a sectional view taken along the line B-B in FIGS. 6(a) to 6(c).

FIG. 30 is a sectional view taken along the line B-B in FIGS. 6(a) to 6(c). Conversely, FIGS. 6(a) to 6(c) correspond to sectional views taken along the lines Qa-Qa, Qb-Qb, and Qc-Qc in FIG. 30.

The active groove 22a has a two-dimensional plan shape in conformity with that of the active groove window opening 81a and has a long and narrow rectangular main groove part 26 and a sub groove part 27 connected to both sides of the longitudinal center of the main groove part. The inside of the main groove part 26 and the sub groove part 27 are connected to each other.

The two-dimensional plan shapes of guard grooves $22b_1$ to $22b_3$ are square ring shapes in conformity with those of the guard groove window openings $81b_1$ to $81b_3$, and their four corners on the inner and outer circumferences are both right angles.

The active grooves 22a are arranged parallel to each other, and parallel to two sides of each of the guard grooves $22b_1$ to $22b_3$.

The width of the main groove part 26 and the widths of the guard grooves $22b_1$ to $22b_3$ are equal, and the distance between adjacent main groove parts 26, the intervals between adjacent guard grooves $22b_1$ to $22b_3$, and the distance between the innermost circumferential guard groove $22b_1$ and the longer side of the adjacent main groove part 26 are equal.

The distance between both ends of the active groove 22a and the innermost circumferential guard groove $22b_1$ is half the distance between the innermost circumferential guard groove $22b_1$ and the longer side of the adjacent main groove part 26.

The direction in which the main groove part 26 of the active groove 22a extends and the direction of the four sides of the guard grooves $22b_1$ to $22b_3$ are aligned to the crystal orientation of the conductive layer 12, and these directions extend to the {1 0 0} direction.

The sectional shape of each of the grooves 22a, $22b_1$ to $22b_3$ is rectangular; the side surface of each of the grooves 22a, $22b_1$ to $22b_3$ is perpendicular to the surface of the conductive layer 12; and therefore, the {1 0 0} plane is exposed at the side surfaces of each of the grooves 22a, and $22b_1$ to $22b_3$. The bottom surfaces of the grooves 22a and $22b_1$ to $22b_3$ are parallel to the surface of the conductive layer 12; and therefore, the {1 0 0} plane is exposed at the bottom surfaces.

In the state shown in FIGS. 6(a) to 6(c), the semiconductor single crystal that forms the substrate to be processed 10 is exposed in each of the grooves 22a and $22b_1$ to $22b_3$. The surface of the substrate to be processed 10 is covered with a field insulating film 43.

Then, when a semiconductor single crystal including an impurity of the second conductivity type is epitaxially grown at the surface of the semiconductor single crystal exposed at the bottom and side surfaces in the grooves 22a and $22b_1$ to $22b_3$, the grooves 22a and $22b_1$ to $22b_3$ are filled inside with the grown semiconductor single crystal of the second conductivity type.

The reference character 23a in FIGS. 7(a) to 7(c) denotes an active groove filling region made of the semiconductor single crystal grown inside the active groove 22a, and the reference characters $23b_1$ to $23b_3$ denote the guard groove filling region made of the semiconductor single crystal grown inside the guard grooves $22b_1$ to $22b_3$. In this example, silicon single crystal is used as the semiconductor single crystal.

Figure 31:
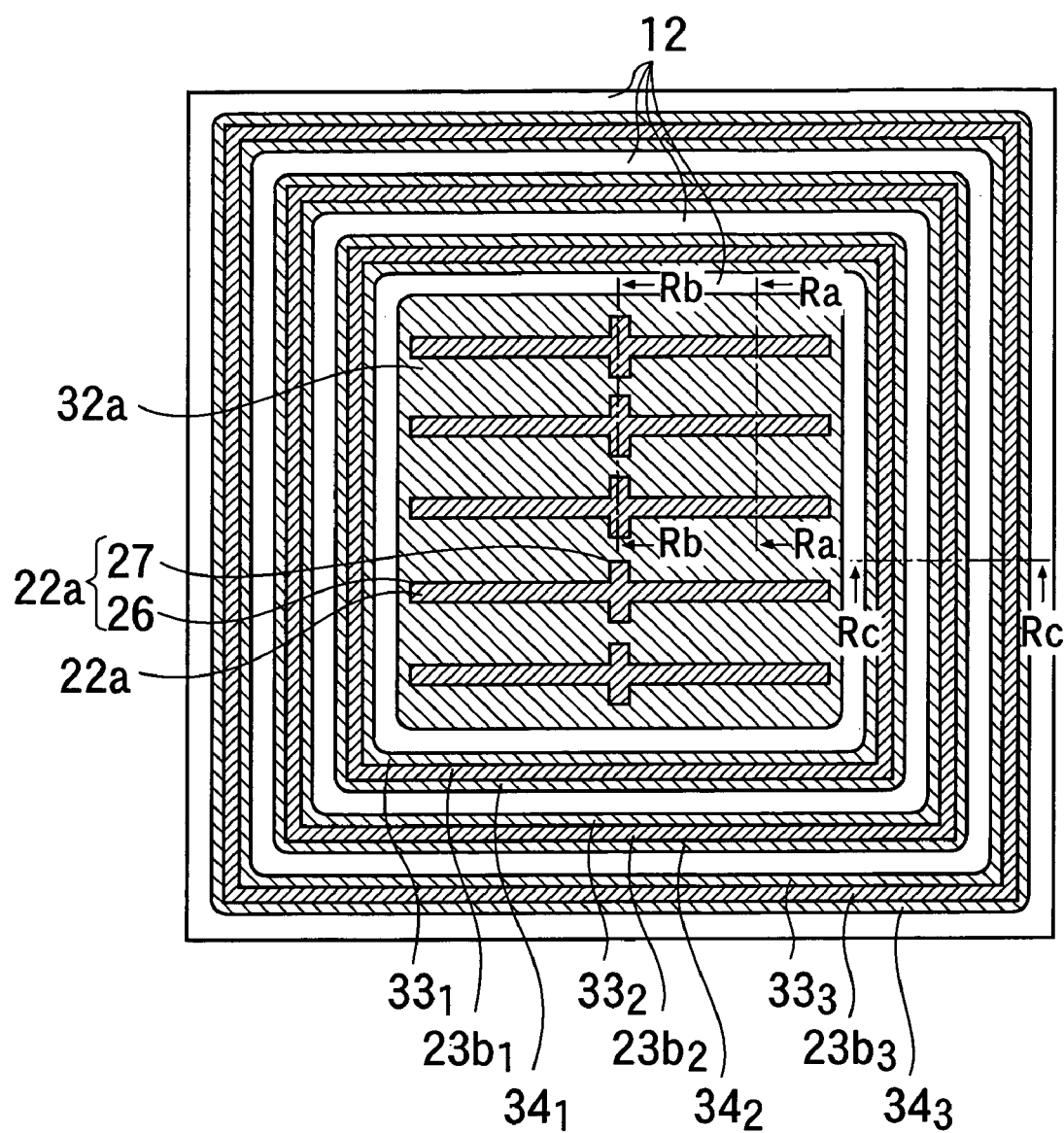
FIG. 31 is a plan view showing the diffusion structure of a semiconductor device according to a first embodiment of the invention and a sectional view taken along the line C-C in FIGS. 7(a) to 7(c).

FIG. 31 is a sectional view taken along the line C-C in FIGS. 7(a) to 7(c). Conversely, FIGS. 7(a) to 7(c) correspond to sectional views taken along the lines Ra-Ra, Rb-Rb, and Rc-Rc in FIG. 31.

In the state of the semiconductor single crystal immediately after the growth, the upper ends of the filling regions 23a and $23b_1$ to $23b_3$ are raised above the surface of the field insulating film 43 used as the mask, and the raised part is etched away so that the heights of the filling regions 23a and $23b_1$ to $23b_3$ are approximately equal to the height of the field insulating film 43 as shown in FIGS. 8(a) to 8(c). The upper parts of the filling regions 23a and $23b_1$ to $23b_3$ may be positioned slightly below the surface of the field insulating film 43.

Then, as shown in FIGS. 9(a) to 9(b), a second mask layer 44 made of an insulating film (such as, a silicon oxide film) is formed on the upper parts of the filling regions 23a and $23b_1$ to $23b_3$ and on the surface of the field insulating film 43 by CVD or the like. As shown in FIGS. 10(a) to 10(c), the second mask layer 44 is patterned to form an opening 82 in a position at the main groove part 26 and the surface of the active groove filling region 23a in the main groove part 26 is exposed at the bottom of the opening 82. The surface of the active groove filling region 23a in the sub groove part 27 and the surfaces of the guard groove filling regions $23b_1$ to $23b_3$ in the guard grooves $22b_1$ to $22b_3$ are covered with the second mask layer 44.

In the state, using the second mask layer 44 as a mask, the upper part of the active groove filling region 23a at the bottom of the opening 82 is etched; and then, as shown in FIGS. 11(a) and 11(b), a buried region 24 made of the lower part of the active groove filling region 23a is formed on the bottom surface of the main groove part 26. The reference numeral 83 denotes a gate groove formed by part where the active groove filling region 23a is removed.

The part of the active groove filling region 23a protected by the second mask layer 44 is not etched, and therefore an active groove filling region 25 remains in the sub groove part 27. The reference numeral 25 in FIG. 11(b) denotes the active groove filling region in the sub groove part 27.

As shown in FIG. 11(c), the guard groove filling regions $23b_1$ to $23b_3$ remain without being etched.

The buried region 24 is in contact with the active groove filling region 25, which is in contact with the base diffusion region 32a. Therefore, the buried region 24 is electrically connected to the base diffusion region 32a by the active groove filling region 25.

The surface of the upper end of the active groove filling region 25 and the surfaces of the upper ends of the guard groove filling region $23b_1$ to $23b_3$ are positioned approximately at the same level as the surface of the field insulating film 43 and thus at a higher level than at least the surface of the conductive layer 12.

Figure 32:
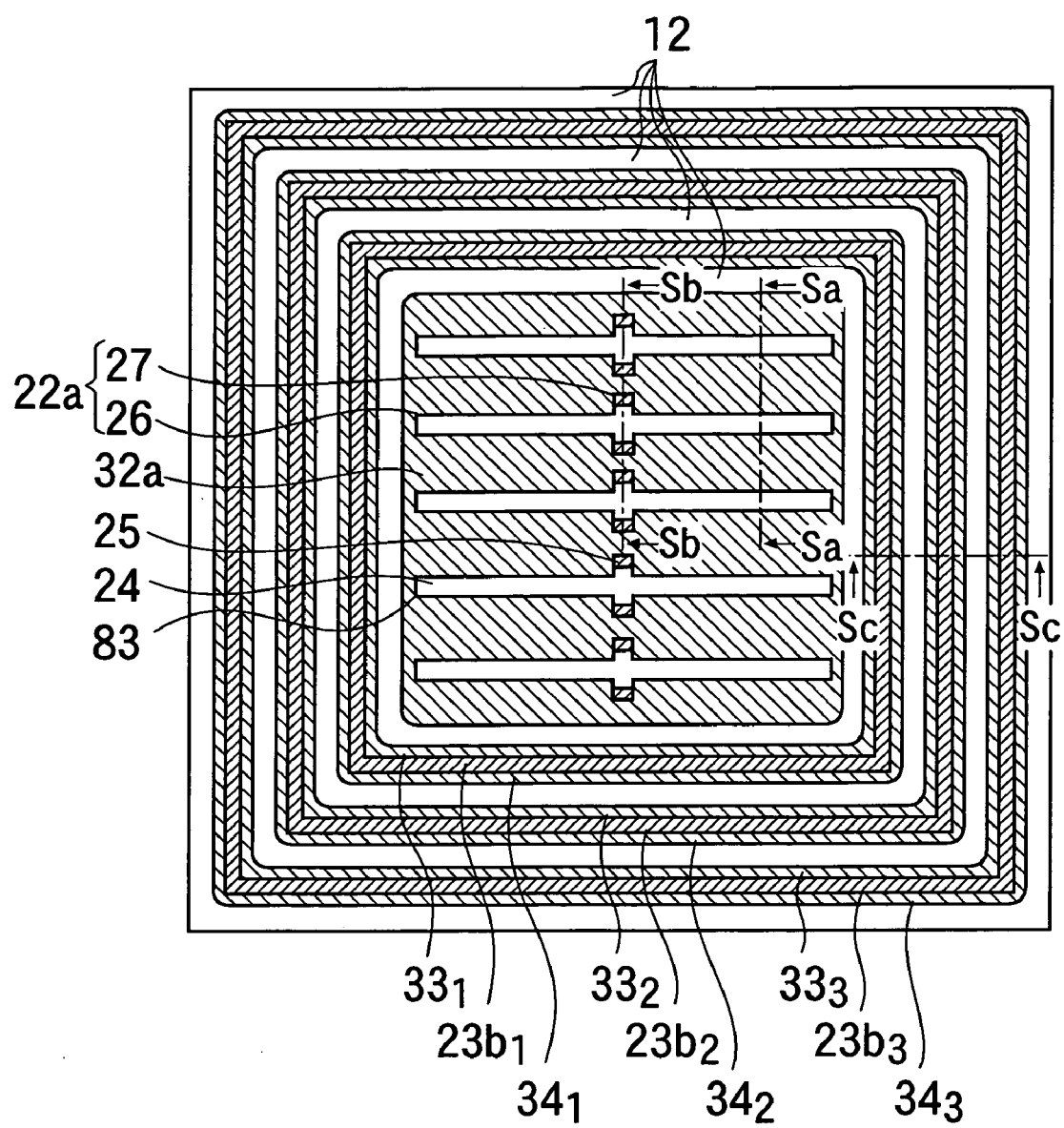
FIG. 32 is a plan view showing the diffusion structure of a semiconductor device according to the present invention and a sectional view taken along the line D-D in FIGS. 11(a) to 11(c).

FIG. 32 is a sectional view taken along the line D-D in FIGS. 11(a) to 11(c). Conversely, FIGS. 11(a) to 11(c) are sectional views taken along the lines Sa-Sa, Sb-Sb, and Sc-Sc in FIG. 32, respectively.

The width of the opening 82 of the second mask layer 44 is larger than the width of the main groove part 26, and the field insulating film 43 is slightly exposed on both sides of the main groove part 26. The opening 82 has a fixed width, and is larger than the width of the main groove part 26 on the sub groove part 27 and only the surface of the active groove filling region 23a is exposed on the bottom surface of the opening 82.

When the active groove filling region 23a is etched, the field insulating film 43 is not etched, so that the width of the gate groove 83 equals the wider width of the opening 82 at the sub groove part 27, and equals the width of the main groove part 26 at the main groove part 26. Therefore, the width of the gate groove 83 is wider at the part of the sub groove part 27.

After the second mask layer 44 is entirely etched away, the field insulating film 43 is partly etched, and as shown in FIGS. 12(a) to 12(c), the surfaces of the guard groove filling regions $23b_1$ to $23b_3$, the surfaces of the active groove filling region 25 and the surface positioned inside prescribed distance from the edge of the base diffusion region 32a are exposed.

When the substrate to be processed 10 is subjected to thermal oxidation treatment in this state, a gate insulating film 45 is formed on the surface of the substrate to be processed 10 including the side surfaces and the bottom surface of the gate groove 83 as shown in FIGS. 13(a) to 13(c) The bottom surface and the side surfaces of the gate groove 83 are covered with the gate insulating film 45. The gate insulating film 45 is in contact with the base diffusion region 32a and the conductive layer 12 at the side surface part extending in the longitudinal direction of the gate groove 83, and also, the gate insulating film 45 is in contact with the active groove filling region 25 in the central part.

Figure 33:
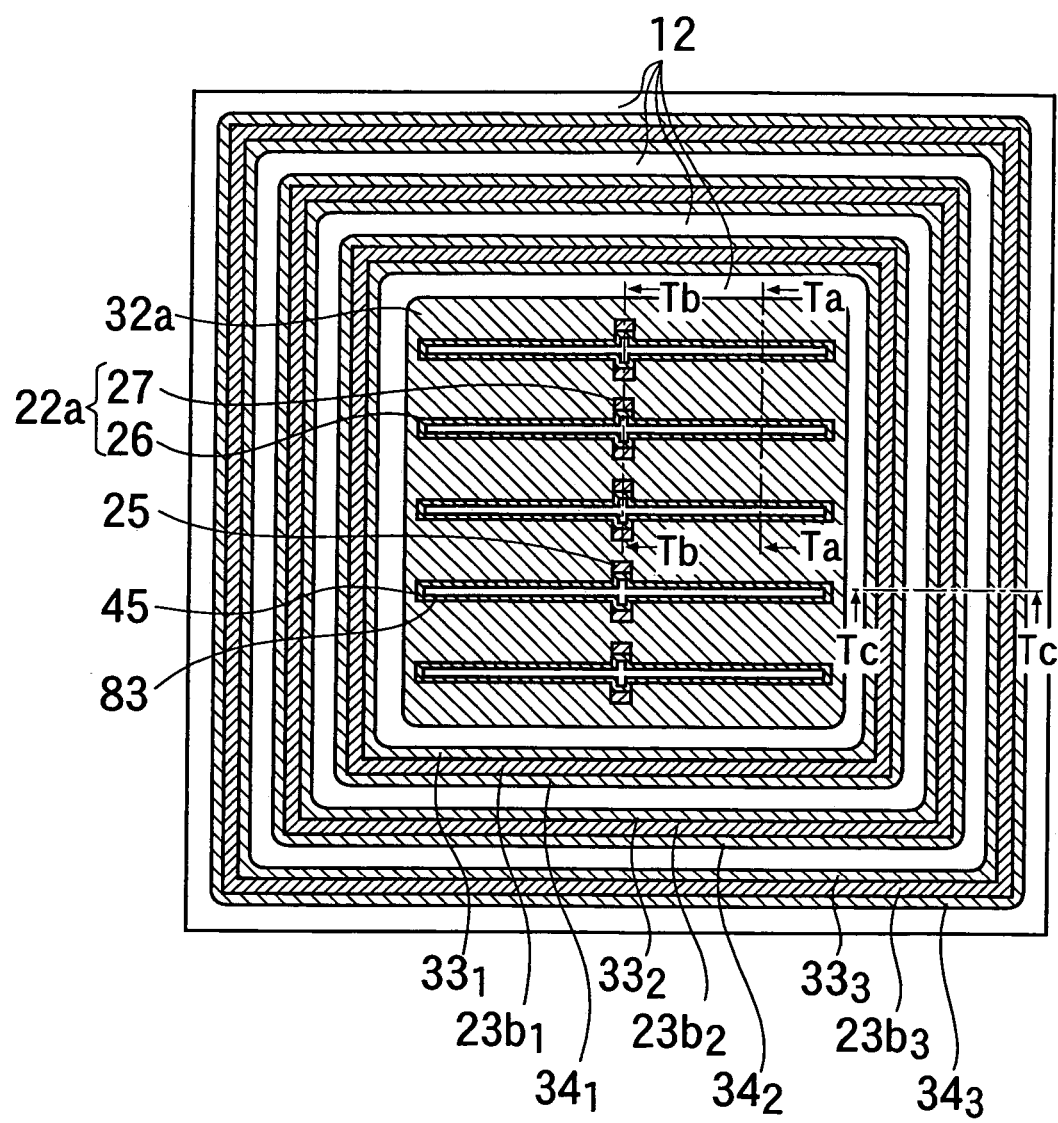
FIG. 33 is a plan view of the diffusion structure of a semiconductor device according to the present invention and a sectional view taken along the line E-E in FIGS. 13(a) to 13(c).

FIG. 33 is a sectional view taken along the line E-E in FIGS. 13(a) to 13(c). Conversely, FIGS. 13(a) to 13(c) are sectional views taken along the lines Ta-Ta, Tb-Tb, and Tc-Tc in FIG. 33.

Note that in this example, the gate insulating film 45 is a silicon oxide film formed by thermal oxidation, while the film may be any of other kinds of insulating films (such as, a silicon nitride film) formed by, for example, CVD.

Then, as shown in FIGS. 14(a) to 14(c), when a conductive material is deposited on the surface of the gate insulating film 45 by CVD or the like to form a thin conductive film 46, the gate groove 83 is filled inside with the thin conductive film 46. The conductive material of the thin conductive film 46 is formed of polysilicon containing an impurity in this example.

Then, as shown in FIGS. 15(a) to 15(c), when the thin conductive film 46 is etched away except for the part inside the gate groove 83, the part remaining in the gate groove 83 forms a gate electrode plug 48.

Figure 34:
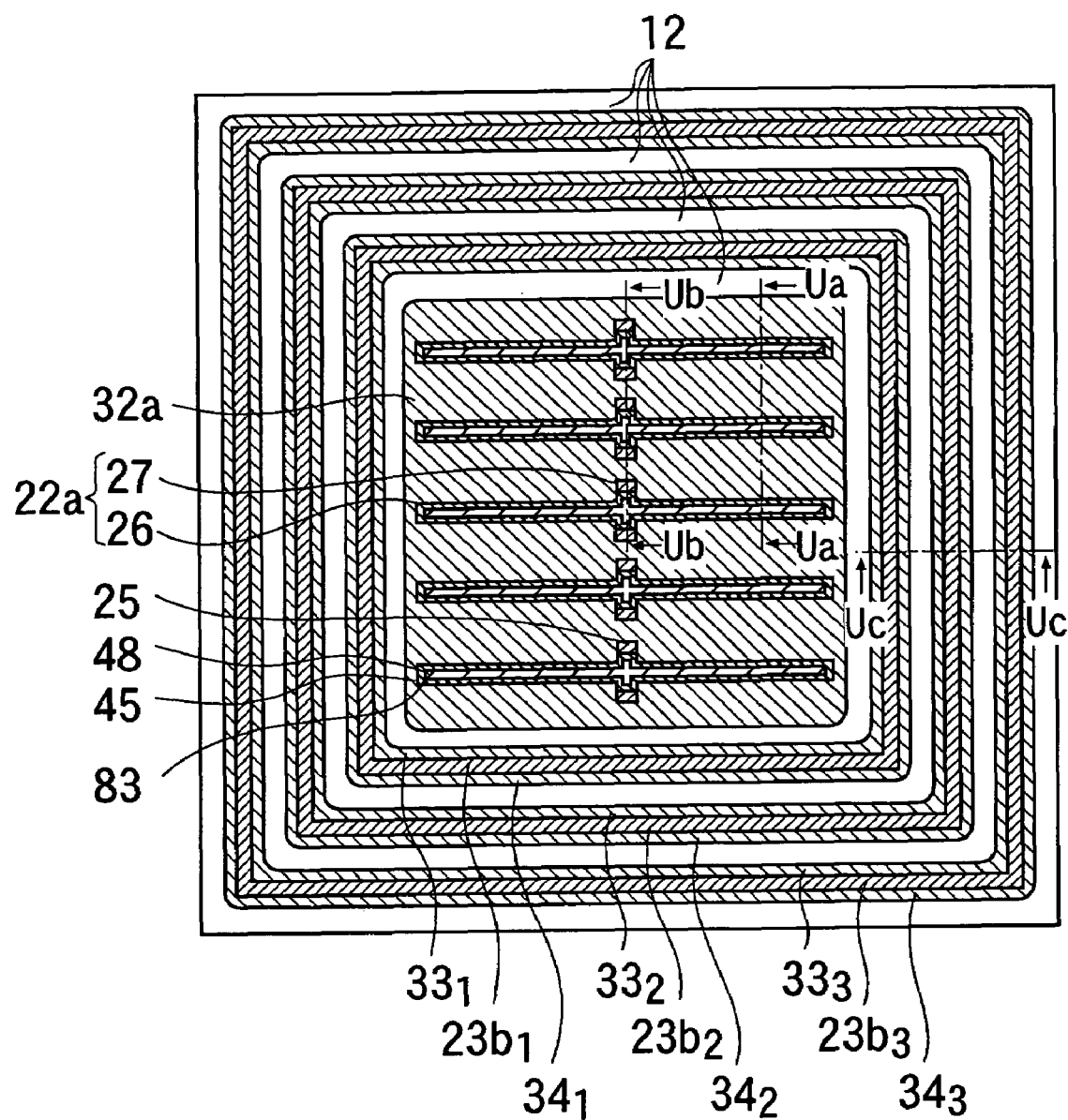
FIG. 34 is a plan view showing the diffusion structure of a semiconductor device according to the present invention and a sectional view taken along the line F-F in FIGS. 15(a) to 15(c).

FIG. 34 is a sectional view taken along the line F-F in FIGS. 15(a) to 15(c). Conversely, FIGS. 15(a) to 15(c) are sectional views taken along lines Ua-Ua, Ub-Ub, and Uc-Uc shown in FIG. 34.

In this example, the gate electrode plugs 48 formed inside the gate grooves 83 are separated from one another. When the thin conductive film 46 is etched, the thin conductive film 46 outside the gate grooves 83 may partly be left for using a patterned resist film so that an interconnection film is formed and the gate electrode plugs 48 may be connected with one another through the interconnection film.

Then, the gate insulating film 45 is etched, and after at least a part of the surface of the base diffusion region 32a is exposed as shown in FIG. 16(a), thermal oxidation treatment is carried out so that a buffer layer 50 made of a silicon oxide film is formed on the surface of the base diffusion region 32a as shown in FIG. 17(a).

At the time, as shown in FIGS. 16(b) and 16(c), the surfaces of the active groove filling region 25 and the guard groove filling regions $23b_1$ to $23b_3$ are exposed once, and the buffer layer 50 is formed on the surfaces as shown in FIGS. 17(b) and 17(c).

Then, as shown in FIGS. 18(a) to 18(c), a patterned resist film 51 is provided on the surface of the buffer layer 50.

The resist film 51 has an opening 52 between gate grooves 83 adjacent to each other, and the buffer layer 50 is exposed at the bottom surface of the opening 52.

When impurity ions of the second conductivity type are irradiated, the impurity ions are transmitted through the buffer layer 50 positioned at the bottom surface of the opening 52, and a high concentration impurity layer of the second conductivity type is formed at the inside surface of the base diffusion region 32a and the active groove filling region 25. The reference numeral 61 in FIGS. 18(a) and 18(b) denotes the high concentration impurity layer of the second conductivity type formed on the inside surface of the base diffusion region 32a, and the high concentration impurity layer formed at the inside surface of the active groove filling region 25 is not shown. The high concentration impurity layer 61 of the second conductivity type is positioned between adjacent gate grooves 83. The high concentration impurity layer of the second conductivity type is not formed on the side of the withstand voltage region (FIG. 18(c)).

Next, the resist film 51 is removed to expose a surface of the buffer layer 50, and then as shown in FIG. 19(a), a resist film 53 having an opening 54 along the longitudinal direction of the main groove part 26 is provided.

The surface of the buffer layer 50 is exposed at the bottom surface of the opening 54, and when an impurity of the first conductivity type is irradiated, the impurity is transmitted through the buffer layer 50 at the bottom surface of the opening 54, and a high concentration impurity layer 62 of the first conductivity type is formed immediately below the bottom surface of the opening 54.

The openings 54 are positioned with a prescribed distance apart from the surface of the active groove filling region 25 and the openings 54 are not formed between the sub groove parts 27 or near the side surfaces of the sub groove parts 27, and the high concentration impurity layer 62 is not formed. Therefore, the high concentration impurity layer 62 of the first conductivity type is not in contact with the active groove filling region 25.

As shown in FIG. 19(c), the high concentration impurity layer of the first conductivity type is not formed on or between the guard groove filling regions $23b_1$ to $23b_3$.

Then, the resist film 53 is removed to expose a surface of the buffer layer 50, and then as shown in FIGS. 20(a) to 20(c), an interlayer insulating film 55 is formed on the buffer layer 50 by CVD or the like.

Then, thermal treatment is carried out to diffuse the impurity of the first conductivity type and the impurity of the second conductivity type in the high concentration impurity layers 61 and 62. Then, as shown in FIG. 21(a), a source diffusion region 64 of the first conductivity type and an Ohmic diffusion region 63 of the second conductivity type having a high surface concentration are formed in the base diffusion region 32a.

The source diffusion region 64 is not in contact with the active groove filling region 25 but is in contact with the gate insulating film 45.

At the time, an Ohmic diffusion region is formed by the high concentration impurity layer of the second conductivity type in the active groove filling region 25.

Then, the interlayer insulating film 55 is patterned, and as shown in FIG. 22(a), a source opening 56a and a gate opening 56b are formed in a position on the Ohmic diffusion region 63 and the source diffusion region 64, and in a position above the gate electrode plug 48, respectively.

The source diffusion region 64 and the Ohmic diffusion region 63 are exposed at the bottom surface of the source opening 56a, and the upper end of the gate electrode plug 48 is exposed at the bottom surface of the gate opening 56b.

The interlayer insulating film 55 remains between the source opening 56a and the gate opening 56b, and the source opening 56a and the gate opening 56b are isolated from each other.

When the source opening 56a and the gate opening 56b are formed, a ground opening 56c is formed, and a surface of the active groove filling region 25 is exposed at the bottom surface of this opening as shown in FIG. 22(b). The ground opening 56c is isolated from the gate opening 56b and connected with the source opening 56a. No opening is formed on the guard groove filling regions $23b_1$ to $23b_3$ (FIG. 22(c)).

Then, as shown in FIGS. 23(a) to 23(c), when a thin metal film 58 is formed on the surface of the substrate to be processed 10 on the side having the source opening 56a and the gate opening 56b, the thin metal film 58 is in contact with the source diffusion region 64, the Ohmic diffusion region 63 in the base diffusion region 32a, the gate electrode plug 48, and the Ohmic diffusion region in the active groove filling region 25.

A thin metal film containing aluminum as a main component formed by sputtering can be used for the thin metal film 58, for example.

Each of the surface concentration of the source diffusion region 64, the Ohmic diffusion region 63 and the gate electrode plug 48 is high, and they form an Ohmic junction with the thin metal film 58.

Then, the thin metal film 58 is patterned and as shown in FIGS. 24(a) and 24(b), the thin metal film 58 is divided into the part in contact with the source diffusion region 64, the Ohmic diffusion region 63 in the base diffusion region 32a, and the Ohmic diffusion region 63 in the active groove filling region 25, and the part in contact with the gate electrode plug 48. The part in contact with the source diffusion region 64 and the Ohmic diffusion region 63 forms a source electrode film 58a and the part in contact with the gate electrode plug 48 forms a gate electrode film 58b.

As shown in FIG. 24(c), at the time of patterning the thin metal film 58, the upper part of the thin metal film 58 above the guard groove filling regions $23b_1$ to $23b_3$ is removed to expose a surface of the interlayer insulating film 55.

Then, as shown in FIGS. 25(a) to 25(c), a patterned insulating protection film 68 is formed on the surface of the substrate to be processed 10 by CVD or the like, and then as shown in FIGS. 26(a) to 26(c), a drain electrode film 71 is formed on the surface of the semiconductor single crystal layer 11 exposed at the back surface of the substrate to be processed 10. In this way, the semiconductor device 1 according to the invention is obtained. A metal that forms an Ohmic junction with the semiconductor single crystal layer 11 is selected for the material of the drain electrode film 71.

FIG. 1 is a sectional view taken along the line G-G in FIGS. 26(a) to 26(c).

A plurality of such semiconductor devices 1 are formed on a single substrate to be processed 10, and in the step of dicing succeeding the step of forming the drain electrode film 71, the substrate to be processed 10 is cut so that the plurality of semiconductor devices 1 are separated from one another. Then a drain electrode film 71 is fixed to the lead frame with a low melting point metal or a conductive paste material.

The surface of a gate pad made of a part of the gate electrode film 58b and the surface of a source pad made of a part of the source electrode film 58a are connected to another lead frame by wire bonding or the like, and the semiconductor device 1 is molded.

Finally, the lead frame is cut and the lead connected to the drain electrode film 71, the lead connected to the gate pad, and the lead connected to the source pad are isolated, so that the resin-encapsulation semiconductor device 1 is obtained.

The resin-encapsulated semiconductor device 1 has its leads connected to an electrical circuit. In use, the part of the base diffusion region 32a positioned between the source diffusion region 64 and the conductive layer 12 and in contact with the gate insulating film 45 is inverted to the first conductivity type, which forms an inversion layer that connects the source diffusion region 64 and the conductive layer 12, so that a current is passed from the drain electrode film 71 to the source electrode film 58a when the source electrode film 58a is connected to the ground potential, a positive voltage is applied to the drain electrode film 71, and a voltage higher than the threshold voltage is applied to the gate electrode plug 48.

Regarding the polarity of voltage for conduction, when the first conductivity type is n type and the second conductivity type is p type, the source electrode film 58a is at the ground potential, the drain electrode film 71 and the gate electrode plug 48 are at a positive voltage, and the threshold voltage is a positive voltage. When the first conductivity type is p type and the second conductivity type is n type, the drain electrode film 71 and the gate electrode plug 48 are at the ground potential, the source electrode film 58a is at a positive voltage, and the threshold voltage is a negative voltage.

When the level of the voltage applied to the gate electrode plug 48 is lower than the threshold voltage, the inversion layer ceases to exist, the semiconductor device 1 attains a cutoff state, and the current no longer flows.

Both the semiconductor device 1 is in a conduction state and a cutoff state, the pn-junction between the base diffusion region 32a and the conductive layer 12 is reverse biased, and a depletion layer expands from the pn junction into the inside of the base diffusion region 32a and the inside of the conductive layer 12.

In the semiconductor device 1 according the present invention, the buried region 24 is electrically connected to the source electrode film 58a through the active groove filling region 25, and therefore the buried region 24 is not at a floating potential but is at the same potential as that of the source diffusion region 64 and the base diffusion region 32a.

When a voltage having the polarity that reverse biases the pn junction is applied between the base diffusion region 32a and the conductive layer 12, the pn junction between the buried region 24 and the conductive layer 12 is also reversely biased. Therefore, inside the conductive layer 12, a depletion layer expands both from the base diffusion region 32a and the buried region 24. Consequently, the part of the conductive layer 12 immediately below the base diffusion region 32a and above the bottom of buried region 24 can easily be entirely depleted inside.

By setting impurity concentration of the conductive layer 12 and the buried region, the width and the distance between the buried regions to be optimum value, inside of the buried region 24 is entirely depleted when a part of the conductive layer 12 positioned between the bottom surface of the base diffusion region 32 and the bottom surface of the buried region 24 is completely depleted. As a result, the electric field intensity immediately below the base diffusion region 32a is relaxed, and the withstand voltage of the active region is improved.

In the withstand voltage region, the guard groove filling regions $23b_1$ to $23b_3$, and the auxiliary diffusion regions $33_1$ to $33_3$ and $34_1$ to $34_3$ on the inner and outer circumferential sides are at a floating potential. The depletion layer expanding laterally from the base diffusion region 32a, the buried region 24 or the like first reaches the innermost circumferential auxiliary diffusion region $33_1$.

By arrival of the depletion layer, potentials of the innermost circumferential auxiliary diffusion region $33_1$, the innermost circumferential guard groove filling region $23b_1$ connected thereto, and the outermost auxiliary diffusion region $34_1$ are stabilized, and a depletion layer starts to expand from these regions.

In this way, the depletion layer sequentially reaches the guard groove filling regions $23b_1$ to $23b_3$ and the inner and outer circumferential auxiliary diffusion regions $33_1$ to $33_3$ and $34_1$ to $34_3$ as it expands from the inside to the outside.

Therefore, the electric field intensity of the region having the guard groove filling regions $23b_1$ to $23b_3$ is relaxed, and the withstand voltage of the withstand voltage region is improved.

In this example, the four sides of each of the guard groove filling regions $23b_1$ to $23b_3$ connect approximately at right angles, and the corners are not rounded, but the rounded outer circumferential auxiliary diffusion regions $34_1$ to $34_3$ are connected to the upper parts of these four corners so that the conductive layer 12 does not form a pn junction with the guard groove filling regions $23b_1$ to $23b_3$ in a shallow region, and forms a pn junction with the outer circumferential auxiliary diffusion regions $34_1$ to $34_3$.

Therefore, the shape of the pn junction is close to a cylindrical junction or a planar junction rather than a spherical junction, which greatly relaxes the electric field intensity.

Note that the {1 0 0} plane of the substrate to be processed 10 is exposed at the bottom surface or side surfaces of each of the active grooves 22a and the guard grooves $22b_1$ to $22b_3$. The active groove filling region 23a and the guard groove filling regions $23b_1$ to $23b_3$ grow from these planes. Therefore, the buried region 24 or the guard groove filling region 23b has no defect so that the withstand voltage is not lowered.

Since the four corners of the guard grooves $22b_1$ to $22b_3$ are rectangular, and therefore a plane other than the {1 0 0} plane such as {1 1 1} is not exposed, and no void is produced at the four corners.

In the semiconductor device according to the present invention, the upper parts of the guard groove filling regions $23b_1$ to $23b_3$ are positioned higher than the surface of the substrate to be processed 10 (the surfaces of the conductive layer 12 and the inner and outer circumferential auxiliary diffusion regions $33_1$ to $33_3$ and $34_1$ to $34_3$) and positioned inside the field insulating film 43. With this structural arrangement, the electric field intensity in the withstand voltage region is more relaxed and the withstand voltage is higher than the case in which the upper ends of the guard groove filling regions have the same height as that of the substrate to be processed 10.

In the above description, the first conductivity type is n type and the second conductivity type is p type, while the first conductivity type may be p type and the second conductivity type may be n type in the above and following embodiments.

The semiconductor device 1 according to the above-described embodiment is, for example, a MOSFET, while the semiconductor device according to the present invention is not limited to this device, and, for example, a pn-junction type IGBT (Insulated gate bipolar transistor) and a Schottky junction type IGBT may be employed.

The reference numeral 2 in FIGS. 27(*a*) to 27(*c*) denotes a pn-junction type IGBT among semiconductor devices according to the present invention.

The semiconductor device 2 has a collector layer 11' made of semiconductor single crystal in place of the semiconductor single crystal layer 11 of the first conductivity type used as the drain layer in the above described embodiment. The collector layer 11' has a (second) conductivity type opposed to that of the semiconductor single crystal layer 11. The other structure is the same as that of the semiconductor device 1 according to the above-described embodiment.

The collector layer 11' forms a pn-junction with the conductive layer 12, and when the semiconductor device 2 conducts, the pn-junction is forward biased, and minority carriers are implanted into the conductive layer 12 from the collector layer 11', which lowers the conduction resistance of the conductive layer 12.

The reference numeral 71' in FIGS. 27(*a*) to 27(*c*) denotes a collector electrode film forming an Ohmic junction with the collector layer 11'.

The reference numeral 3 in FIGS. 28(*a*) to 28(*c*) denotes a semiconductor device according to the present invention when the device is a Schottky barrier type IGBT.

In the semiconductor device 3, the semiconductor single crystal layer 11 according to the first embodiment is removed by the process of polishing, a conductive layer 12 having a concentration lower than that of the semiconductor single crystal layer 11 is exposed, and a Schottky electrode film 72 is formed on the surface.

At least the part of the Schottky electrode film 72 in contact with the conductive layer 12 is made of a material that forms the Schottky junction with the conductive layer 12, and examples thereof include chromium. The other structure is the same as that of the semiconductor device 1 according to the first embodiment.

The polarity of the Schottky junction is configured such that the junction is forward biased when the pn-junction between the conductive layer 12 and the base diffusion region 32*a* is reverse biased. Therefore, when a voltage of the polarity that turns on the semiconductor device 3 is applied to the electrode films 58*a*, 58*b*, and 72, the Schottky junction is forward-biased, and minority carriers are implanted from the Schottky electrode film 72 into the conductive layer 12, which lowers the conduction resistance of the conductive layer 12.

Note that if the semiconductor single crystal layer 11 has a low concentration and can form a Schottky junction with the Schottky electrode film 72, a Schottky electrode film may be formed on the surface of the semiconductor single crystal layer 11. In this case, the semiconductor single crystal layer 11 may be polished to reduce its thickness so that its conduction resistance can be reduced.

The reference numeral 4 in FIGS. 36(*a*) to 36(*c*) denotes a low conduction resistance type semiconductor device.

The semiconductor device 4 has a low resistance region 29 of the first conductivity type having a higher concentration than the conductive layer 12 and the low resistance region 29 is positioned under the base diffusion region 32*a* in the semiconductor device 1 according to the first embodiment. The other structure is the same as that of the semiconductor device 1 according to the first embodiment.

Figures 37A, 37B, 37C:
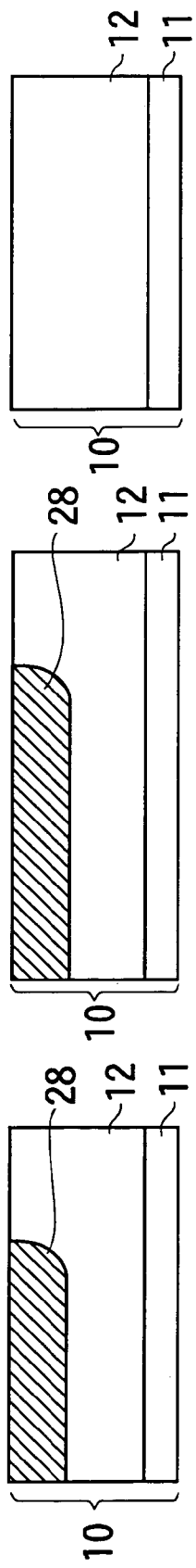
FIGS. 37(a) to 37(c) are sectional views for illustrating the process of manufacturing the device (1).

In order to describe the positional relation between the low resistance region 29 and the base diffusion region 32*a*, the process of manufacturing the semiconductor device 4 will be briefly described. An impurity of the first conductivity type is irradiated into the conductive layer 12 and diffused therein, so that the low resistance region of the first conductivity type having a smaller area than the base diffusion region and a higher concentration than the conductive layer 12 is formed in the conductive layer 12 in the active region. The reference numeral 28 in FIGS. 37(*a*) and 37(*b*) denotes the low resistance region, and the low resistance region 28 is not formed in the withstand voltage region (FIG. 37(*c*)). FIGS. 37(*a*) to 37(*c*) show the state in which the surface of the conductive layer 12 including the low resistance region 28 is exposed.

Figures 38A, 38B, 38C:
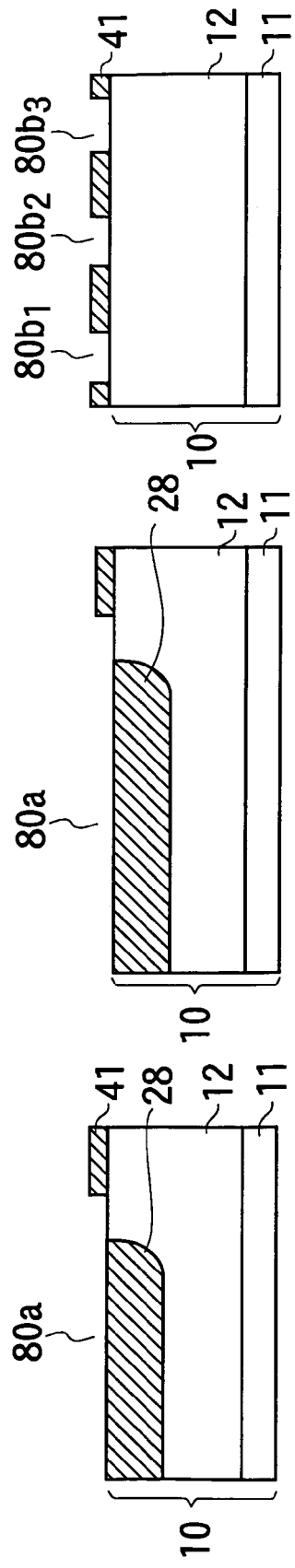
FIGS. 38(a) to 38(c) are sectional views for illustrating the process of manufacturing the device (2).
Figure 41:
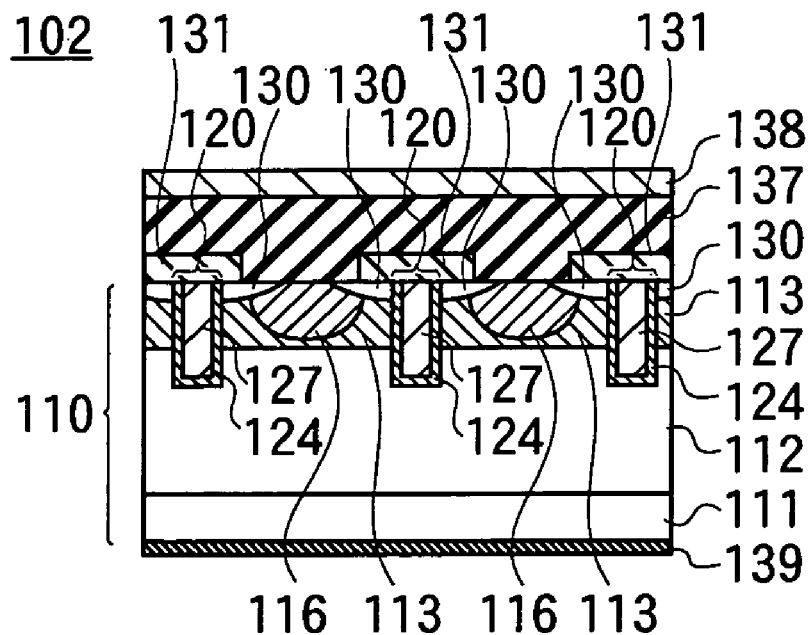
FIG. 41 is a sectional view for illustrating the diffusion structure of a conventional MOSFET.
Figure 42:
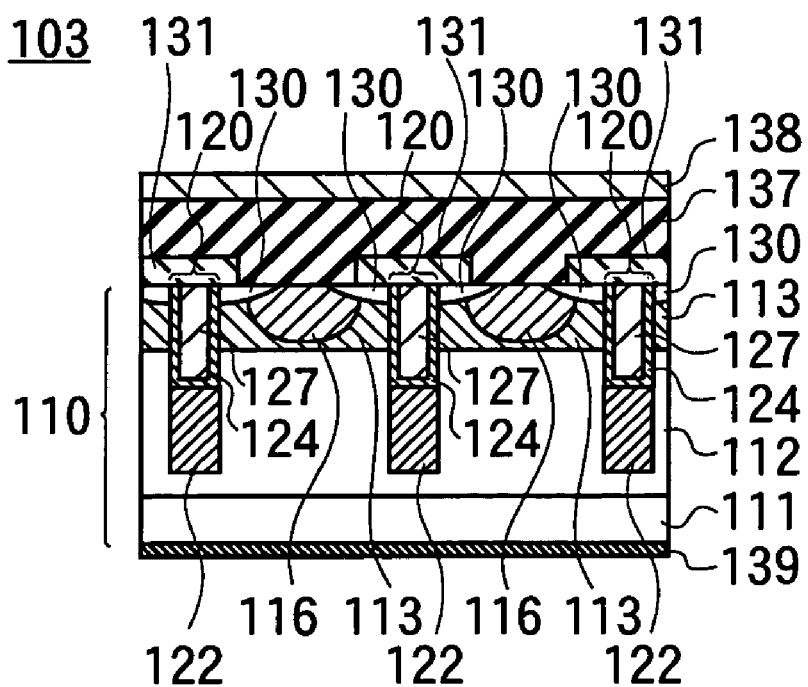
FIG. 42 is a sectional view for illustrating the diffusion structure of an improved conventional MOSFET.

As shown in FIGS. 38(*a*) to 38(*c*), a square or rectangular base diffusion opening 80*a* is formed in a first mask layer 41 formed on the surface of the substrate to be processed 10. The surface of the low resistance region 28 and the surface of the conductive layer 12 within a prescribed distance from the low resistance region 28 are exposed at the bottom surface of the base diffusion opening 80*a*.

A plurality of (three in this example) square ring-shaped auxiliary diffusion openings $80b_1$ to $80b_3$ are formed concentrically around the base diffusion opening 80*a*, and the surface of the conductive layer 12 is exposed at the bottom surface of the auxiliary diffusion openings $80b_1$ to $80b_3$.

When an impurity of the second conductivity type is irradiated in this state, the impurity of the second conductivity type is implanted into the inside surfaces of the low resistance region 28 and the conductive layer 12 positioned under the bottom surfaces of the openings 80*a* and $80b_1$ to $80b_3$.

The concentration of the implanted impurity of the second conductivity type is high and the surface of the low resistance region 28 attains the second conductivity type. Consequently, as shown in FIGS. 39(*a*) to 39(*b*), high concentration impurity layers 31*a* and $31b_1$ to $31b_3$ of the second conductivity type are formed under the bottom surfaces of the base diffusion opening 80*a* and the auxiliary diffusion openings $80b_1$ to $80b_3$, respectively.

Then, thermal treatment is carried out to let the high concentration impurity layers 31*a* and $31b_1$ to $31b_3$ of the second conductivity type diffuse to a position shallower than the low resistance region 29. Then, as shown in FIGS. 40(*a*) to 40(*c*), the base diffusion region 32*a* is formed on the low resistance region 29 and the auxiliary diffusion regions $32b_1$ to $32b_3$ are formed to have the same depth of the base diffusion region 32*a*.

In this way, the upper part of the low resistance region 28 is replaced by the base diffusion region 32*a* as the diffusion region of the second conductivity type, and the low resistance region 29 made of the remainder of the low resistance region 28 is positioned immediately under the base diffusion region 32*a*.

The outer circumference of the low resistance region 29 is positioned on a side that is inner than the edge of the base diffusion region 32*a*, and the low resistance region 29 is not exposed at the surface of the conductive layer 12. The low resistance region 29 is not provided under the auxiliary diffusion regions $32b_1$ to $32b_3$.

When the semiconductor device 4 (FIGS. 36(*a*) to 36(*c*)) conducts, a current is passed across the low resistance region 29; and therefore, the conduction resistance is small.

The steps in and after FIGS. 40(a) to 40(c) are the same as the steps following the step of forming the base diffusion region 32a according to the first embodiment; and therefore, these steps are omitted.

In each of the above described embodiments, the sub groove part 27 is positioned on both sides of the center of the main groove part 26, and the active groove filling region 25 is formed on both sides of the central position of the main groove part 26, but they may be positioned at ends of the main groove part or a plurality of such parts may be provided for one main groove part 26.

Figure 35:
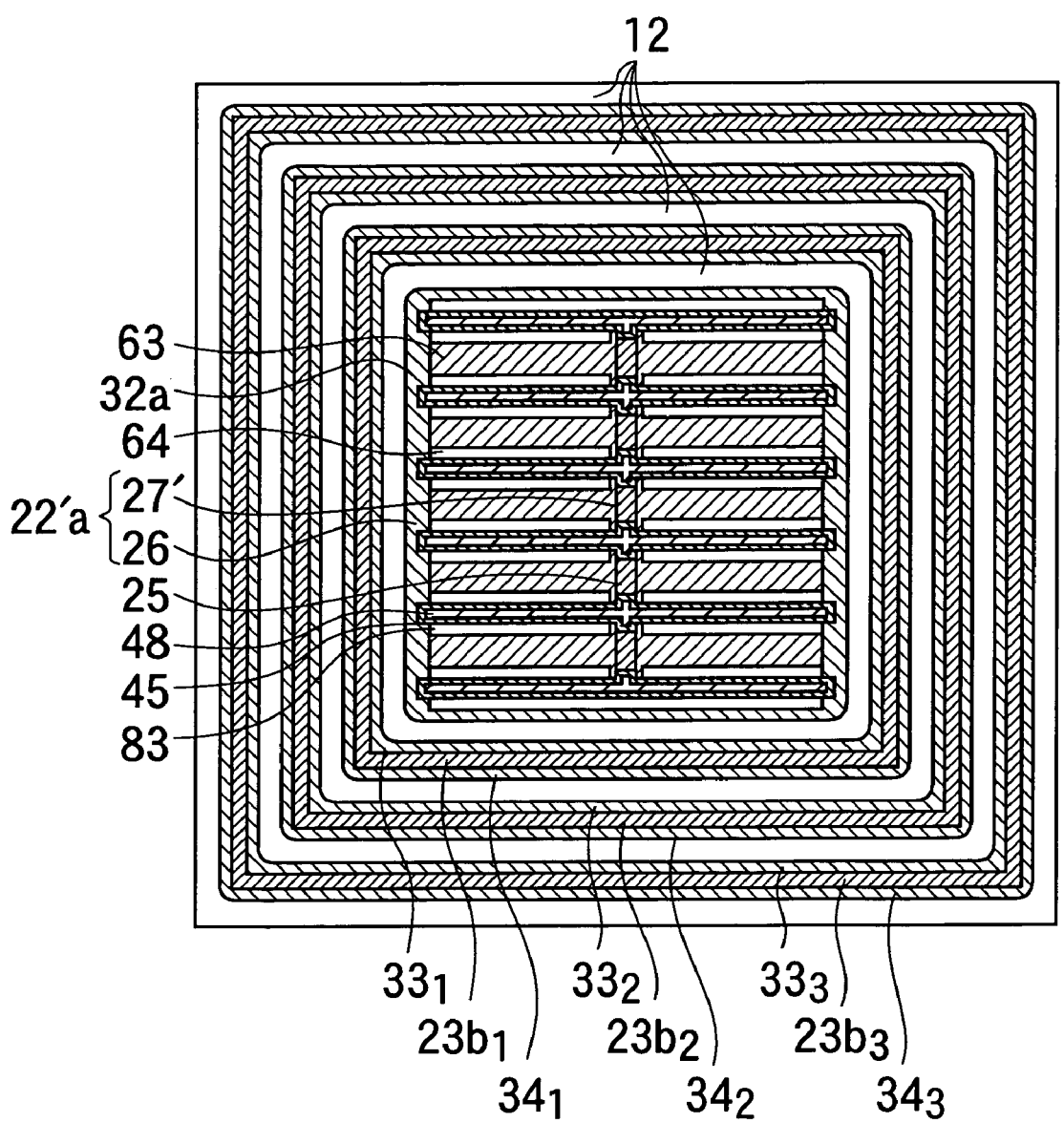
FIG. 35 is a plan view of a semiconductor device according to the present invention in which adjacent main groove parts are connected by a sub groove part.

In each of the described embodiments, the active grooves 22a are isolated from each other, but the sub groove part 27 of each of the active grooves 22a may be elongated, and the adjacent main groove parts 26 may be connected with the sub groove parts 27 as in the semiconductor device 5 as shown in FIG. 35.

In the above described embodiments, the sub groove part 27 is positioned on both sides of the main groove part 26, but the sub groove part 27 may be positioned on one side of the main groove part 26.

Summarily, in the semiconductor devices 1 to 4 according to the present invention, the active groove filling regions 25 are provided not to isolate the gate electrode plugs 48 positioned in a single active groove 22a. A plurality of gate grooves 83 are formed in a single active groove 22a, and when the gate electrode plugs 48 in the single active groove 22a are isolated by the active groove filling region 25, the pattern of the gate electrode film 58b that connects the gate electrode plugs 48 would be complicated. According to the present invention, the patterns of the gate electrode film 58b and the source electrode film 58a may be arranged in a comb-like manner so that the comb teeth parts can alternately be engaged between each other.

According to each of the above described embodiments, each of the guard grooves $22b_1$ to $22b_3$ has four sides thereof connected at right angles, but the present invention is not limited to the arrangement because the guard grooves $22b_1$ to $22b_3$ having rounded corners and polygonal shaped corners are covered by the invention.

The above described active groove filling region 23a and the guard groove filling region 23b are made of a silicon single crystal epitaxially grown in the active groove 22a and the guard grooves $22b_1$ to $22b_3$, or a polycrystale filling region made of a grown polycrystale semiconductor of the second conductivity type.

We claim:

1. A semiconductor device comprising:
a substrate to be processed, having a conductive layer of a first conductivity type;
a base diffusion region of a second conductivity type formed on an inside surface of the conductive layer; and
an active groove formed in a position where the base diffusion region is provided in the conductive layer and a bottom surface of the active groove is deeper than a bottom surface of the base diffusion region;
wherein the active groove has a long and narrow main groove part and a sub groove part connected to a longitudinal side surface of the main groove part;
a buried region of the second conductivity type whose upper part is lower than the base diffusion region, the buried region being arranged on a bottom surface of the main groove part;
a gate groove is made of a portion of the main groove part above the buried region;
a gate insulating film is provided on a side surface of the gate groove;
a conductive gate electrode plug in contact with the gate insulating film and electrically insulated from the buried region, the conductive gate electrode plug being arranged in the gate groove;
a source diffusion region of the first conductivity type is provided inside surface of the base diffusion region in a position where the source diffusion region is in contact with the gate insulating film and the source diffusion region is isolated from the conductive layer by the base diffusion region; and
an active groove filling region of the second conductivity type having an upper part thereof in contact with the base diffusion region and a lower part thereof in contact with the buried region, the active groove filling region being disposed on the bottom surface of the sub groove part.

2. The semiconductor device according to claim 1, wherein an upper end of the active groove filling region is higher in position than the surface of the conductive layer.

3. The semiconductor device according to claim 1, further comprising a source electrode film formed on a surface of the source diffusion region, and
wherein the source electrode film is in contact with a surface of the active groove filling region.

4. The semiconductor device according to claim 3, wherein an impurity layer of the second conductivity type is formed by diffusion in a part of the surface of the active groove filling region in contact with the source electrode film.

5. The semiconductor device according to claim 4, wherein the source electrode film is in contact with the base diffusion region, and
the active groove filling region is in contact with the base diffusion region.

6. The semiconductor device according to claim 1, further comprising:
a plurality of ring-shaped guard grooves concentrically surrounding the active groove and separated from one another at prescribed intervals; and
a guard groove filling region of the second conductivity type provided in the guard groove.

7. The semiconductor device according to claim 1, further comprising a drain electrode film electrically connected with the conductive layer at a back surface of the substrate to be processed.

8. The semiconductor device according to claim 1, wherein
a collector layer of the second conductivity type in contact with the conductive layer to form a pn junction, and
a collector electrode film electrically connected with the collector layer, the collector electrode film being disposed at the back surface of the substrate to be processed.

9. The semiconductor device according to claim 1, wherein a Schottky electrode film forming a Schottky junction with the conductive layer is disposed at the back surface of the substrate to be processed.

10. A method for manufacturing a semiconductor device, the semiconductor device having:
a substrate to be processed, having a conductive layer of a first conductivity type;
a base diffusion region of a second conductivity type formed on an inside surface of the conductive layer; and an active groove formed in a position where the base diffusion region is provided in the conductive layer and a bottom surface of the active groove is deeper than a bottom surface of the base diffusion region;

wherein the active groove has a long and narrow main groove part and a sub groove part connected to a longitudinal side surface of the main groove part;

a buried region of the second conductivity type whose upper part is lower than the base diffusion region, the buried region being arranged on a bottom surface of the main groove part;

a gate groove is made of a portion of the main groove part above the buried region;

a gate insulating film is provided on a side surface of the gate groove;

a conductive gate electrode plug in contact with the gate insulating film and electrically insulated from the buried region, the conductive gate electrode plug being arranged in the gate groove;

a source diffusion region of the first conductivity type disposed in an inside surface of the base diffusion region in a position where the source diffusion region is in contact with the gate insulating film and the source diffusion region is isolated from the conductive layer by the base diffusion region; and an active groove filling region of the second conductivity type having an upper part thereof in contact with the base diffusion region and a lower part thereof in contact with the buried region, the active groove filling region being disposed on the bottom surface of the sub groove part, the method comprising:

forming the active groove in the manner that the base diffusion region is exposed at the upper side surface of the active groove and the conductive layer is exposed at the lower side surface of the active groove after the base diffusion region is formed;

growing a semiconductor filler of the second conductivity type in the active groove, and then, removing the upper part of the semiconductor filler positioned in the main groove part to a position lower than the bottom surface of the base diffusion region by etching the surface of the semiconductor filler in the state that the sub groove part is covered with a mask film;

forming the buried region using the remaining lower part, and forming the gate groove using the part of the main groove part where the semiconductor filler is removed.

* * * * *